(12) United States Patent
Choi et al.

(10) Patent No.: US 7,867,902 B2
(45) Date of Patent: Jan. 11, 2011

(54) METHODS OF FORMING A CONTACT STRUCTURE

(75) Inventors: Suk-Hun Choi, Suwon-si (KR);
Chang-Ki Hong, Seongnam-si (KR);
Hyun-Jun Sim, Hwaseong-si (KR);
Yoon-Ho Son, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/499,832

(22) Filed: Jul. 9, 2009

(65) Prior Publication Data

US 2010/0009531 A1 Jan. 14, 2010

(30) Foreign Application Priority Data

Jul. 10, 2008 (KR) .................... 10-2008-0066858

(51) Int. Cl.
*H01L 21/44* (2006.01)
*H01L 21/311* (2006.01)
*H01L 21/4763* (2006.01)

(52) U.S. Cl. .................... 438/672; 438/634; 438/699; 257/E21.305

(58) Field of Classification Search ................ 438/672, 438/3, 634, 699, 675; 257/E21.305, E21.649
See application file for complete search history.

(56) References Cited

U.S. PATENT DOCUMENTS

| | | | | |
|---|---|---|---|---|
| 2006/0141771 A1* | 6/2006 | Jang | ........................... | 438/633 |
| 2006/0151887 A1* | 7/2006 | Oh et al. | ..................... | 257/774 |
| 2008/0173931 A1* | 7/2008 | Ho et al. | ..................... | 257/324 |
| 2008/0247214 A1* | 10/2008 | Ufert | ......................... | 365/148 |

FOREIGN PATENT DOCUMENTS

| | | |
|---|---|---|
| JP | 2001-053026 | 2/2001 |
| KR | 100253355 B1 | 1/2000 |
| KR | 1020020048615 A | 6/2002 |

\* cited by examiner

*Primary Examiner*—Walter L Lindsay, Jr.
(74) *Attorney, Agent, or Firm*—Volentine & Whitt, PLLC

(57) ABSTRACT

In a method of forming a contact structure, a first insulation layer including a first contact hole is formed on a substrate. A metal layer including tungsten is formed to fill the first contact hole. A planarization process is performed on the metal layer until the first insulation layer is exposed to form a first contact. A second contact is grown from the first contact. The second contact is formed without performing a photolithography process and an etching process to prevent misalignments.

17 Claims, 25 Drawing Sheets

METHODS OF FORMING A CONTACT STRUCTURE

BACKGROUND

1. Field of the Invention

Example embodiments relate to a method of forming a contact structure, and more particularly, to a method of forming a contact structure having an improved alignment margin.

A claim of priority is made to Korean Patent Application No. 2008-66858, filed Jul. 10, 2008, the contents of which are incorporated herein by reference.

2. Description of the Related Art

As semiconductor devices have become highly integrated, areas of unit cells have been greatly reduced, and also operational voltages have been lowered. Accordingly, design rules may be decreased to less than 40 nm, and thus contacts need to be smaller and have smaller gaps therebetween.

It may be difficult to overcome limitations of photolithography processes and ensure sufficient process margins because of resolution limits. However, electrical characteristics of the semiconductor devices need to be maintained despite the reduced areas of unit cells.

FIGS. 1 to 3 illustrate a conventional method of forming a contact structure. Referring to FIG. 1, an insulation layer 20 is formed on a substrate 10. After forming a first hole in the insulation layer 20, a first barrier layer 30 and a first metal layer are formed in the first contact hole to form a contact 40 in the insulation layer 20.

Referring to FIG. 2, a second insulation layer 50 is formed on the structure, including insulation layer 20 and contacts 40, and thereafter a second contact hole 55 is formed in the second insulation layer 50.

Referring to FIG. 3, a second barrier layer 60 and a second metal layer are formed in the second contact hole 55 in the second insulation layer 50, to form a second contact 70.

According to the conventional method, misalignments may be easily generated between the first contact 40 and the second contact 70. In order to avoid misalignments, various methods such as double patterning technology (DPT) may be utilized. However, the DPT may require a plurality of etching processes and photolithography processes.

SUMMARY

Therefore, example embodiments provide a method of forming a contact structure that reduces misalignments and improves an alignment margin.

According to example embodiments,—there is provided a method of forming a contact structure, wherein a first insulation layer including a first contact hole is formed on a substrate. A metal layer including tungsten is formed to fill the first contact hole. A planarization process is performed on the metal layer until the first insulation layer is exposed to form a first contact. A second contact is grown from the first contact.

In example embodiments, the second contact may be grown by performing a plasma treatment or an annealing process under an oxygen atmosphere.

In example embodiments, the annealing process may be performed at a temperature of about 300° C. to about 600° C. for about 30 seconds to about 15 minutes.

In example embodiments, an upper portion of the first contact may be oxidized during the annealing process to form a lower portion of the second contact.

In example embodiments, the second contact comprises tungsten oxide.

In example embodiments, the second contact protrudes from the first insulation layer.

In example embodiments, the metal layer may be planarized by performing a first chemical mechanical polishing (CMP) process using a first slurry composition which has a first concentration of hydrogen peroxide. Then, a second CMP process may be performed using a second slurry composition which has a second concentration of hydrogen peroxide. The first concentration of hydrogen peroxide is higher than the second concentration of hydrogen peroxide.

In example embodiments, the first contact may have a convex upper face.

In example embodiments, prior to forming the metal layer, a barrier layer may be formed on the first contact hole.

In example embodiments, the barrier layer may include titanium or titanium nitride.

In example embodiments, prior to forming the first insulation layer, a conductive structure may be formed on the substrate.

In example embodiments, a second insulation layer is formed on the first insulation layer to cover the second contact.

In example embodiments, the second contact may include a lower portion and an upper portion. The lower portion of the second contact may be disposed in the first insulation layer and formed by oxidizing an upper portion of the first contact and the upper portion of the second contact may be disposed in the second insulation layer.

In example embodiments, a second contact hole exposing the conductive structure may be formed. The second contact hole may be filled by forming a conductive layer on the second insulation layer to form a third contact electrically connected to the conductive structure.

In example embodiments, the third contact may be electrically isolated from the first and second contacts.

In example embodiments, the second contact may be removed to form a second contact hole exposing the first contact. Then, a third contact hole exposing the conductive structure is formed. Then, a conductive layer may be formed on the second insulation layer to fill the second and third contact holes.

In example embodiments, prior to forming a third contact hole, a mask covering the second contact hole and covering a portion of the second insulation layer corresponding the conductive structure may be formed on the second insulation layer.

In example embodiments, prior to forming the conductive layer, a barrier layer may be formed on sidewalls of the second and third contact holes.

In example embodiments, the second contact hole may include a lower portion and an upper portion. The lower portion may be disposed in the first insulation layer and the upper portion may be disposed in the second insulation layer.

In example embodiments, the conductive layer may be formed using a material having a lower resistance than tungsten oxide.

Accordingly, a second contact is formed by growing a first contact including tungsten. That is, tungsten in the first contact is oxidized to form the second contact including tungsten oxide on the first contact.

The second contact is formed by a self-aligned process without performing a photolithography process and an etching process despite a high degree of integration. Thus, a method of manufacturing a contact may be simplified and efficiently reduce misalignments.

Additionally, a barrier layer may not be formed on the second contact because the second contact is formed by growing the first contact including tungsten. Accordingly, failures of the semiconductor device caused by bridges of the remaining barrier layer may be prevented so that the reliability of the semiconductor device may be improved.

In accordance with example embodiments of the invention, time and expense necessary to form a contact structure may be reduced. Further, the contact structure is formed by a self-aligned process to provide good electrical characteristics.

BRIEF DESCRIPTION OF THE DRAWINGS

Example embodiments will become apparent from the following description with reference to the accompanying drawings, in which.

DETAILED DESCRIPTION OF EMBODIMENTS

Figure 1:
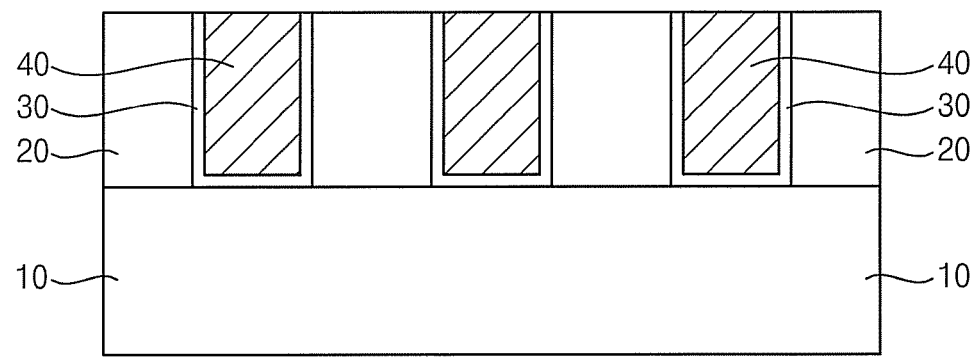
FIGS. 1 to 3 are cross-sectional views illustrating a method of manufacturing a contact structure in accordance with conventional methods.
Figure 2:
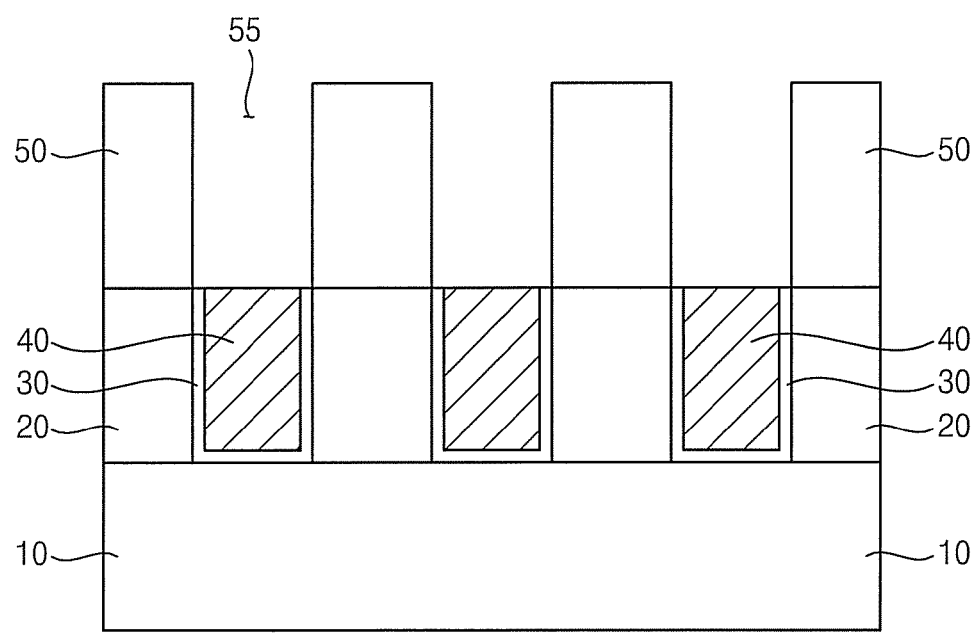
Figure 3:
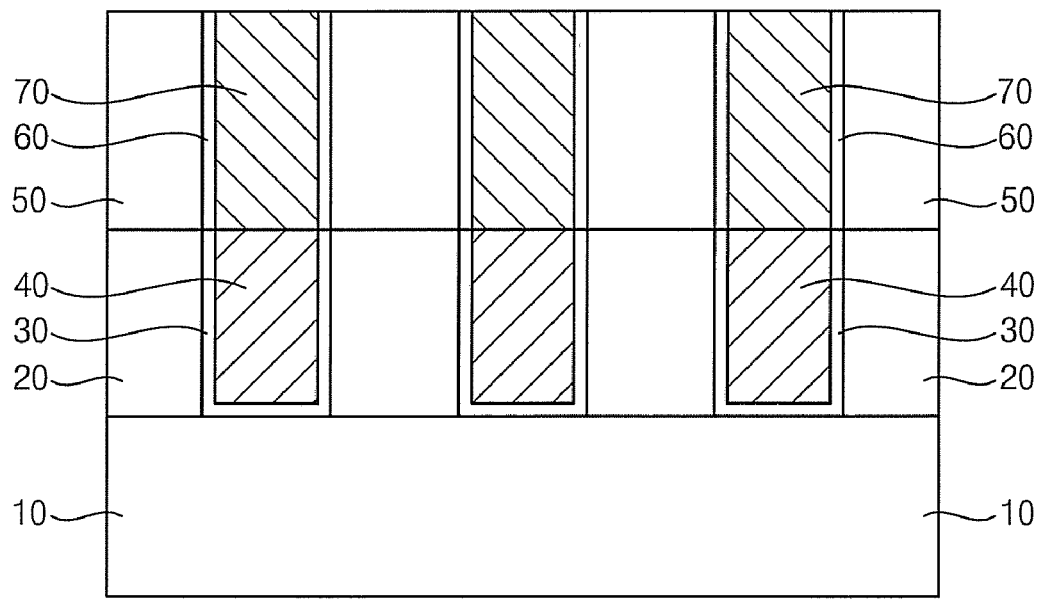

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component region, layer or section from another region, layer or section. Thus, a first element, component, region, layer or section discussed below could be termed a second element component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 4:
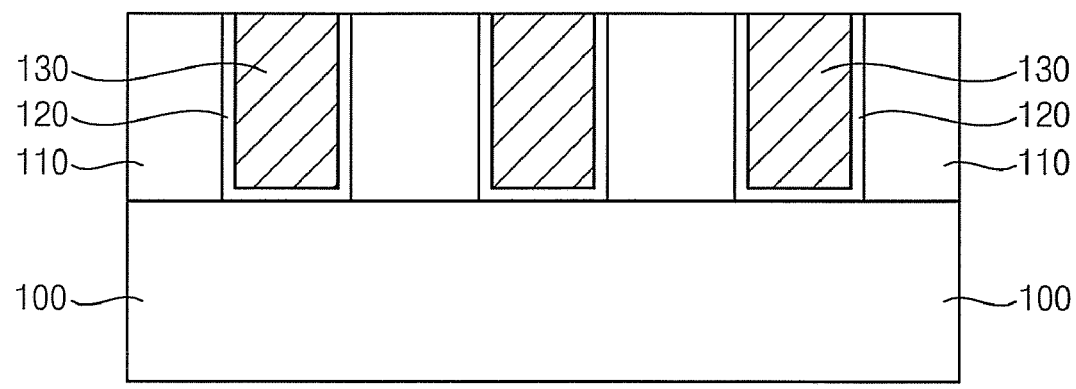
FIGS. 4 to 7 are cross-sectional views illustrating a method of manufacturing a contact structure in accordance with a first embodiment.

FIGS. 4 to 9 are cross-sectional views illustrating a method of forming a contact structure in accordance with a first embodiment. Referring to FIG. 4, a first insulation layer is formed on a substrate 100. The substrate 100 may include a silicon substrate, a germanium substrate, a silicon-germanium substrate, etc. Alternatively, the substrate 100 may include a silicon-on-insulator (SOI) substrate or a germanium-on-insulator (GOI) substrate. The substrate 100 may include a structure (not illustrated) such as an impurity region, a pad, a plug, a contact, a conductive layer pattern, an insulation layer pattern, etc. For example, the substrate 100 may include a capacitor or a gate structure.

The first insulation layer may be formed using silicon oxide such as borophosphosilicate glass (BPSG), phosphosilicate glass (PSG), undoped silicate glass (USG), spin-on glass (SOG), flowable oxide (FOx), tetraethyl orthosilicate (TEOS), plasma-enhanced tetraethyl orthosilicate (PE-TEOS), high-density plasma chemical vapor deposition (HDP-CVD) oxide, etc. The first insulation layer may be formed by a chemical vapor deposition (CVD) process, a low-pressure chemical vapor deposition (LPCVD) process, a plasma-enhanced chemical vapor deposition (PECVD) process, an HDP-CVD process, etc. In example embodiments, the first insulation layer may be planarized by a chemical mechanical polishing (CMP) process.

Referring to FIG. 4, an etching process is performed to form a contact hole and a first insulation layer pattern 110. The contact hole may expose the substrate 100 or a structure such as an impurity region, a pad, a plug, a contact, a conductive layer pattern, an insulation layer pattern, etc. A barrier layer 120 is conformally formed along the profile of the contact hole. The barrier layer 120 may prevent the generation of a high resistance and increase adhesion between the substrate 100 and a first contact 130. The barrier layer 120 may be formed using a metal having a high melting point by a sputtering process. For example, the barrier layer 120 may be formed using titanium (Ti), titanium nitride (TiN), titanium tungsten (TiW), titanium/titanium nitride, tantalum (Ta), tantalum nitride (TaN), etc. The barrier layer 120 may have a thickness of about 100 Å.

Referring to FIG. 4, a metal layer including tungsten is formed on the barrier layer 120 and the first insulation layer pattern 110 to fill the contact hole. The metal layer may have a thickness of about 5,000 Å to about 10,000 Å from a surface of the first insulation layer pattern 110. A planarization process is performed on the metal layer until the first insulation layer pattern 110 is exposed to form a first contact 130 having a convex upper face. The planarization process may include a CMP (chemical mechanical polishing) process. In example embodiments, the planarization process may include a first CMP process and a second CMP process. The first CMP process may be performed using a first slurry composition which has a substantially higher polishing selectivity with respect to the metal layer than the first insulation layer pattern 110. For example, the first slurry composition may include more than about 2 percent by weight of hydrogen peroxide. The second CMP process may be performed using a second slurry composition which has a substantially higher etch selectivity with respect to the first insulation layer pattern 110 than the metal layer in order to prevent dishing of the first contact 130. For example, the second slurry composition may include less than about 0.5 percent by weight of hydrogen peroxide.

In example embodiments, after the metal layer is formed, the first CMP process may be performed using the first slurry composition to polish the metal layer. When the first insulation layer pattern 110 is exposed, the second CMP process may be performed using the second slurry composition. Since the second slurry composition has the higher polishing selectivity with respect to the first insulation layer pattern 110 than the metal layer, additional polishing of the first contact 130 may be prevented to ensure formation of the first contact 130 as having a substantially convex upper face.

Figure 5:
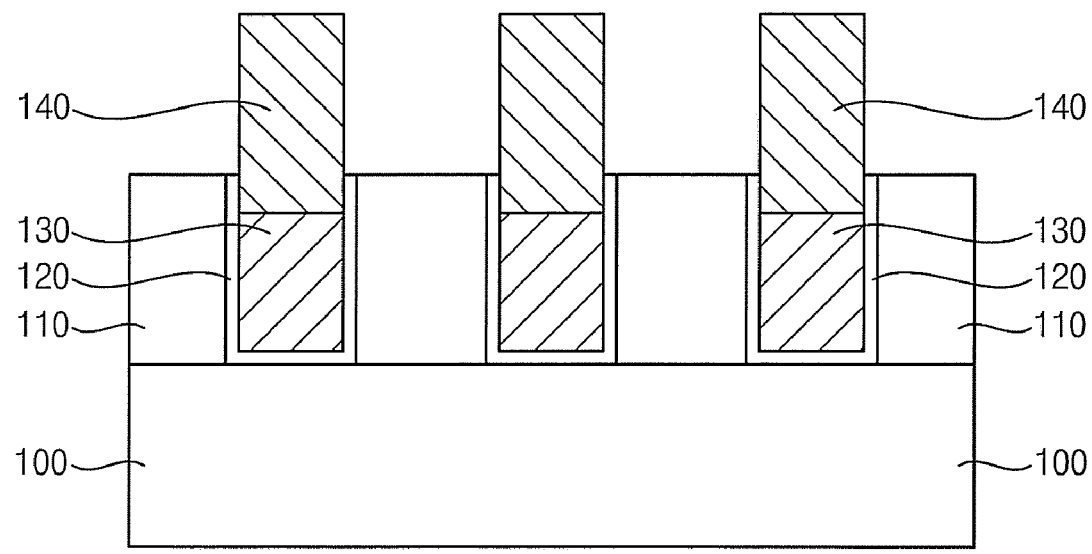

Referring to FIG. 5, the second contact 140 is grown by performing an oxidation process from the first contact 130. When the oxidation process is performed, a tungsten oxide layer used for the second contact 140 may be upwardly formed on the first contact 130 using tungsten as a seed. Principles of formation of the tungsten oxide layer used for the second contact 140 may be substantially similar to those of formation of a silicon oxide layer which is formed by oxidizing a silicon substrate such as a local oxidation of silicon (LOCOS) process.

Figure 8:
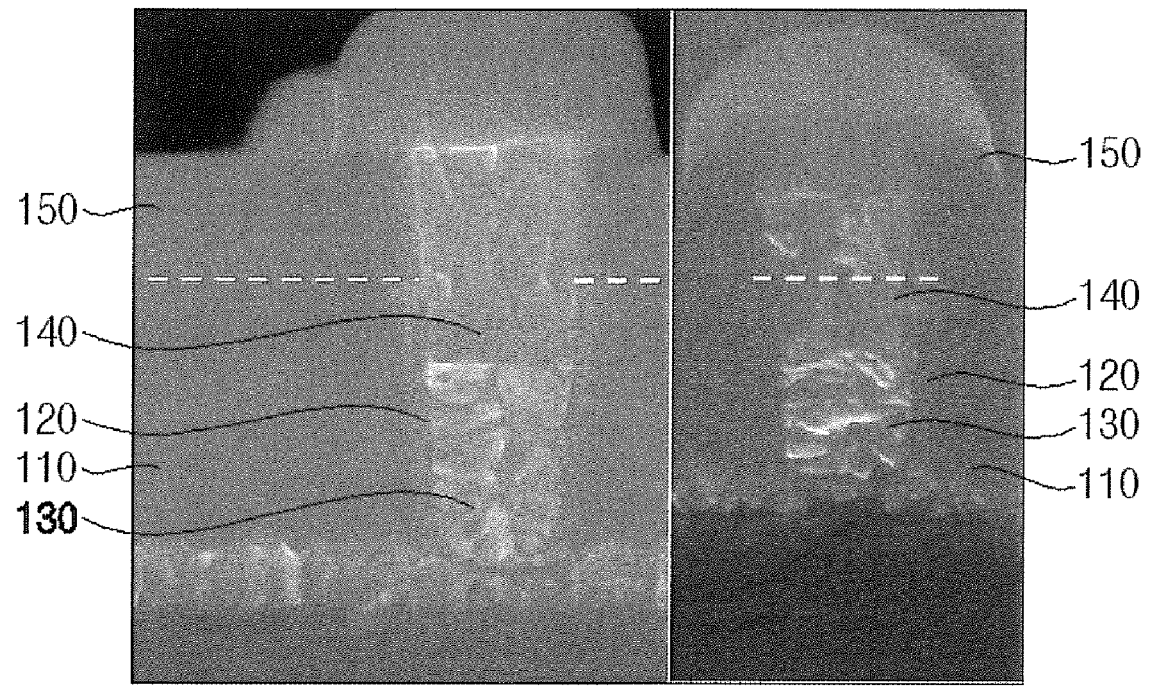
FIGS. 8 and 9 are electron microscope images showing a contact structure formed by the method in accordance with the first embodiment.

The tungsten oxide layer may be formed on a surface of the first contact 130 by combination between tungsten and oxygen to form the second contact 140 on the first contact 130. As illustrated in FIG. 8, the tungsten oxide layer used for the second contact 140 may be grown upwardly from the first contact 130 by the oxidation process. Accordingly, the second contact 140 may be formed without photolithography processes to increase alignment margin and prevent defects caused by misalignments.

Figure 41:
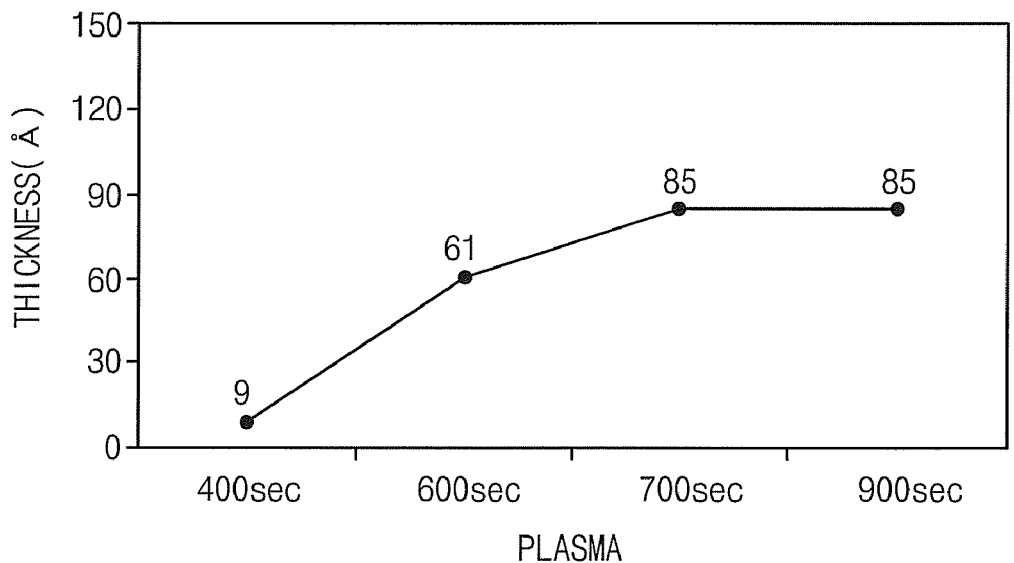
FIGS. 41 and 42 are graphs illustrating the thickness of a tungsten oxide layer formed by a plasma treatment and an annealing process, respectively, in accordance with the first embodiment.
Figure 42:
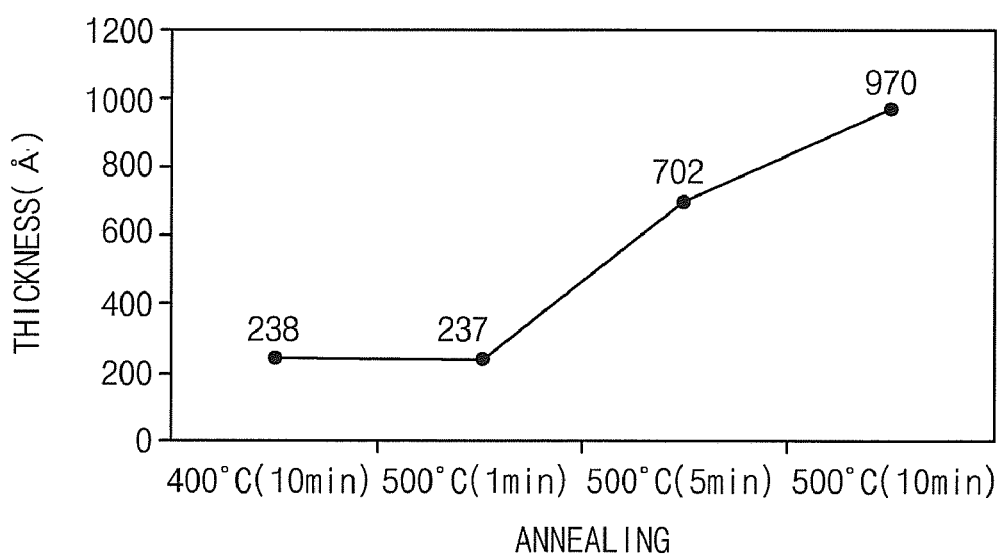

The tungsten oxide layer used for the second contact 140 may be formed by performing an annealing process under an oxygen atmosphere. For example, the annealing process may be performed at a temperature of about 300° C. to about 600° C. for about 30 seconds to about 15 minutes. As illustrated in FIG. 42, when the annealing process is performed at a temperature of about 500° C. for about 10 minutes in an oxygen atmosphere, a tungsten oxide layer having a thickness of about 970 Å may be formed on the first contact 130. As another example, the tungsten oxide layer used for the second contact 140 may be formed by performing a plasma treatment in an oxygen atmosphere. For example, the plasma treatment may be performed by applying a power of about 40 W to about 60 W in an oxygen atmosphere. As illustrated in FIG. 41, when the plasma treatment is performed by applying a power of about 50 W for about 700 seconds to 900 seconds, a tungsten oxide layer having a thickness of about 85 Å may be formed on the first contact 130.

The thickness of the tungsten oxide layer may be selected in view of the type of semiconductor memory device. The thickness of the tungsten oxide layer used for the second contact 140 may be adjusted by a duration time of the oxidation process. The thickness of the tungsten oxide layer may be several thousands angstrom (Å) according to the duration time of the oxidation process. That is, as the duration time of the oxidation process is made longer, the thickness of the tungsten oxide layer may be made greater.

Figure 43:
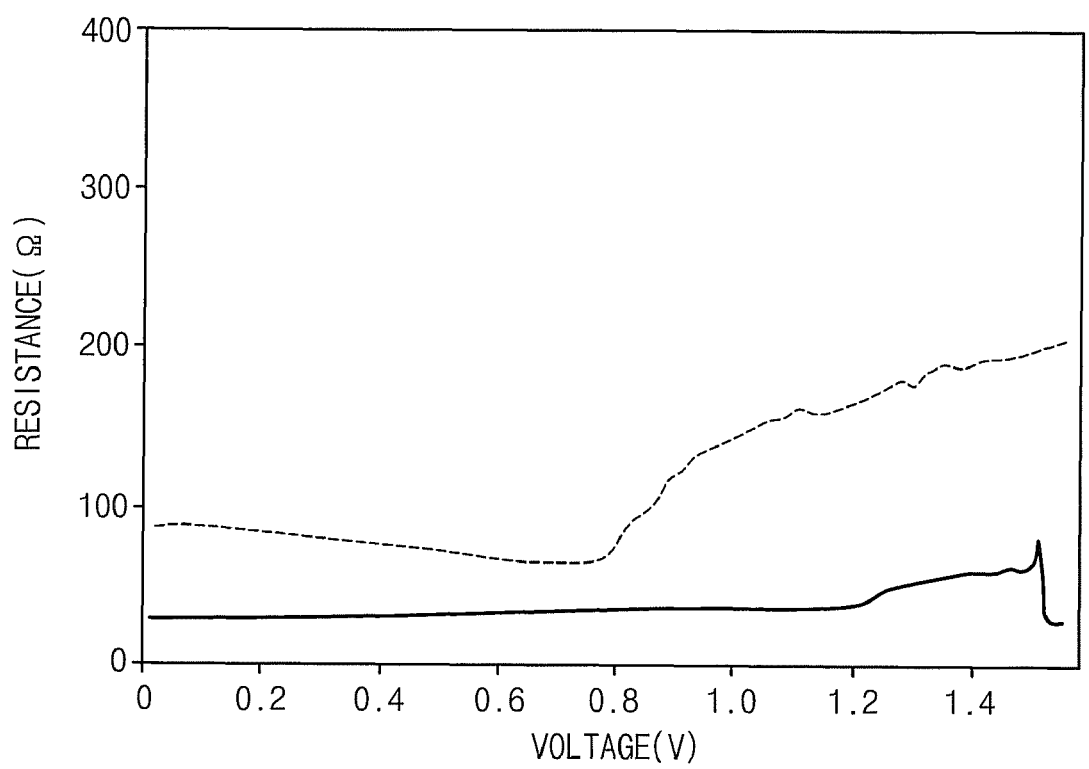
FIG. 43 is a graph illustrating the resistance of the contact structure in accordance with the first embodiment.

The resistance of a contact structure including the first contact 130 and the second contact 140 may be increased due to the tungsten oxide layer used for the second contact 140. In FIG. 43, the solid line represents resistance of a contact structure in the case that an oxidation process is not performed, and thus a tungsten oxide layer is not be formed on the first contact 130. In FIG. 43, the dotted line represents resistance of a contact structure in the case that an annealing process has been performed at a temperature of about 500° C. for about 5 minutes, so as to form a tungsten oxide layer used for the second contact 140. As illustrated in FIG. 43, when the tungsten oxide layer is not formed, the first contact 130 may have a resistance of about 34Ω to about 37Ω. When the annealing process is performed, the contact structure including the first contact 130 and the second contact 140 may have resistance of about 185Ω to about 220Ω. When the resistance of the contact structure in a memory device is less than about 1,000Ω, the semiconductor memory device is not affected by the resistance of the contact. Conventionally, tungsten oxide is not used for a contact because tungsten oxide may have substantially higher resistance than tungsten. However, as mentioned above, although formation of the tungsten oxide layer increases the resistance of the contact structure, operation characteristics of the semiconductor memory device are not be deteriorated by an increase of the resistance, and the tungsten oxide layer formed by growing tungsten in the first contact 130 simplifies formation of the contact structure including the first contact 130 and the second contact 140.

Figure 44:
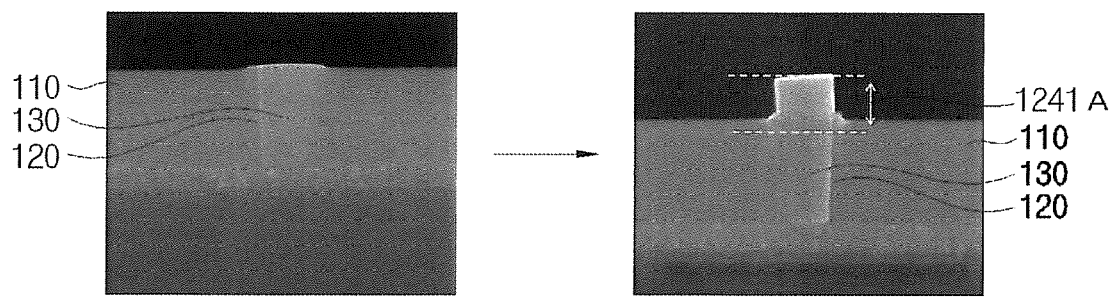
FIGS. 44 and 45 are electron microscope images showing the thickness of a tungsten oxide layer according to a surface shape of a first contact.
Figure 45:
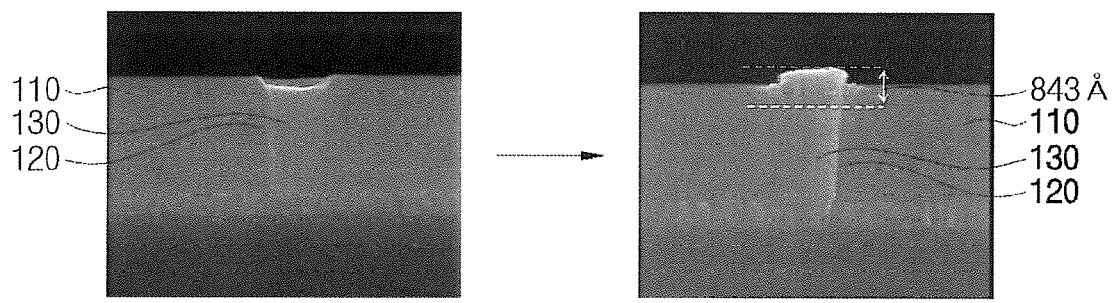

The thickness and uniformity of the tungsten oxide layer used for the second oxide layer 140 may be adjusted by a surface shape of the first contact 130. As illustrated in FIG. 44, when the first contact 130 has a convex upper face, the thickness of the tungsten oxide layer may be about 1,241 Å and have a uniform upper face. However, as illustrated in FIG. 45, when the first contact 130 has a concave upper face, the thickness of the tungsten oxide layer may be about 843 Å and the upper face of the tungsten oxide layer may not be uniform. Accordingly, when the first contact 130 has the convex upper face, the tungsten oxide layer formed by the oxidation process may be substantially thicker by about 15% compared to the first contact 130 having the concave upper face. Additionally, the first contact 130 having the convex upper face may be more uniform than the first contact 130 having the concave upper face.

As mentioned above, the surface shape of the first contact 130 may be determined by the planarization process of the metal layer. In order to obtain the first contact 130 having the convex upper face, the planarization process may include the first CMP process and the second CMP process. The first CMP process may be performed using the first slurry composition which has a substantially higher polishing selectivity with respect to the metal layer than the first insulation layer pattern 110. For example, the first slurry composition may include more than about 2 percent by weight of hydrogen peroxide. The second CMP process may be performed using the second slurry composition which has a substantially higher etch selectivity with respect to the first insulation layer pattern 110 than the metal layer in order to prevent dishing of the first contact 130. For example, the second slurry composition may include less than about 0.5 percent by weight of hydrogen peroxide.

The oxidation may be initiated from the surface of the first contact 130 during the oxidation process to form the tungsten oxide layer used for the second contact 140. During the oxidation process, an upper portion of the first contact 130 may be oxidized, and thus thickness of the first contact 130 may be decreased. Accordingly, a lower face of the second contact 140 may be substantially lower than an upper face of the first insulation layer pattern 110.

Meanwhile, the barrier layer 120 may not be oxidized during the oxidation process because the barrier layer may include a metal having a high melting point, and thus the barrier layer may be maintained at a constant height. However, tungsten in the first contact 130 may be consumed by the oxidation process, and thus the height of the first contact 130 may be decreased. Accordingly, an upper face of the first contact 130 may substantially lower than an upper face of the barrier layer 120.

As illustrated in FIG. 8, the tungsten oxide layer used for the second contact 140 may protrude from the first insulation layer pattern 110 because the tungsten oxide layer used for the second contact 140 may be grown upwardly from the first contact 130. Accordingly, second contact 140 may include a first portion substantially lower than the upper face of the first insulation layer pattern 110 and a second portion substantially higher than the upper face of the first insulation layer pattern 110. In example embodiment, a thickness ratio of the first portion and the second portion may be about 1:3. For example, when the second portion of the second contact 140 has a thickness of about 1,000 Å, the first portion of the second contact 140 may have a thickness of about 300 Å. Accordingly, when the first contact 130 is formed, the thickness of the first contact 130 may be determined by considering the oxidation amount of the first contact 130 during formation of the tungsten oxide layer used for the second contact 140.

Figure 6:
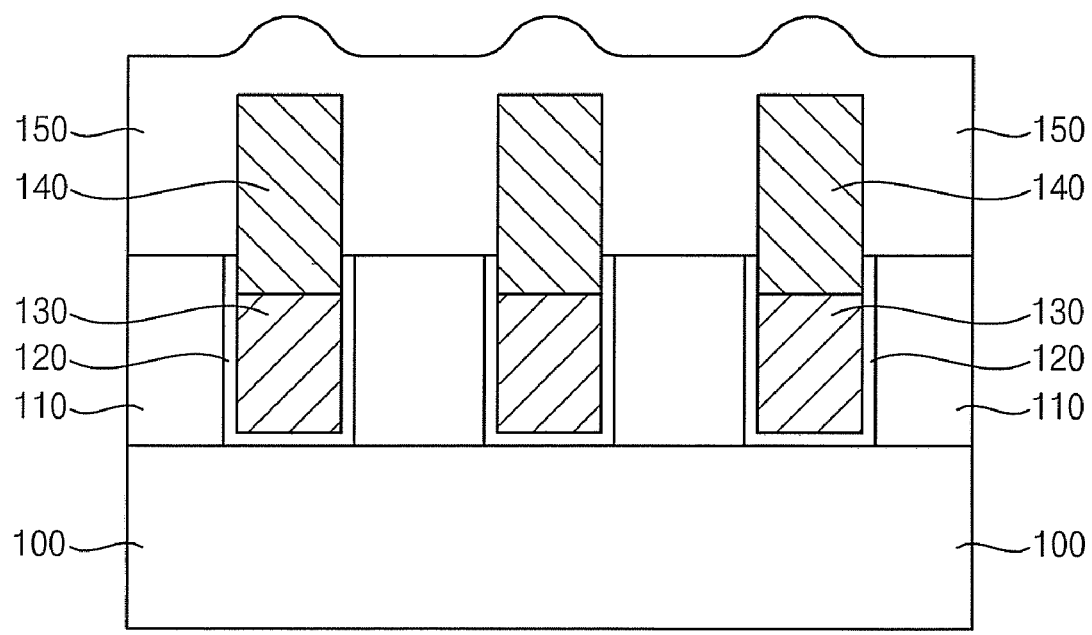

Referring to FIG. 6, a second insulation layer 150 is formed on the first insulation layer pattern 110 to cover the second contact 140. The second insulation layer 150 may be formed using BPSG; PSG; USG; SOG, FOx, TEOS, PE-TEOS, HDP-CVD oxide, etc. by a CVD process, a LPCVD process, a PECVD process, a HDP-CVD process, etc. In example embodiments, the second insulation layer 150 may be formed using a material substantially the same as the first insulation layer pattern 110. The second insulation layer 150 may include a protruded portion corresponding to the second contact 140. Accordingly, the height of the protruded portion in the second insulation layer 150 may be determined by the height of the second contact 140.

Figure 7:
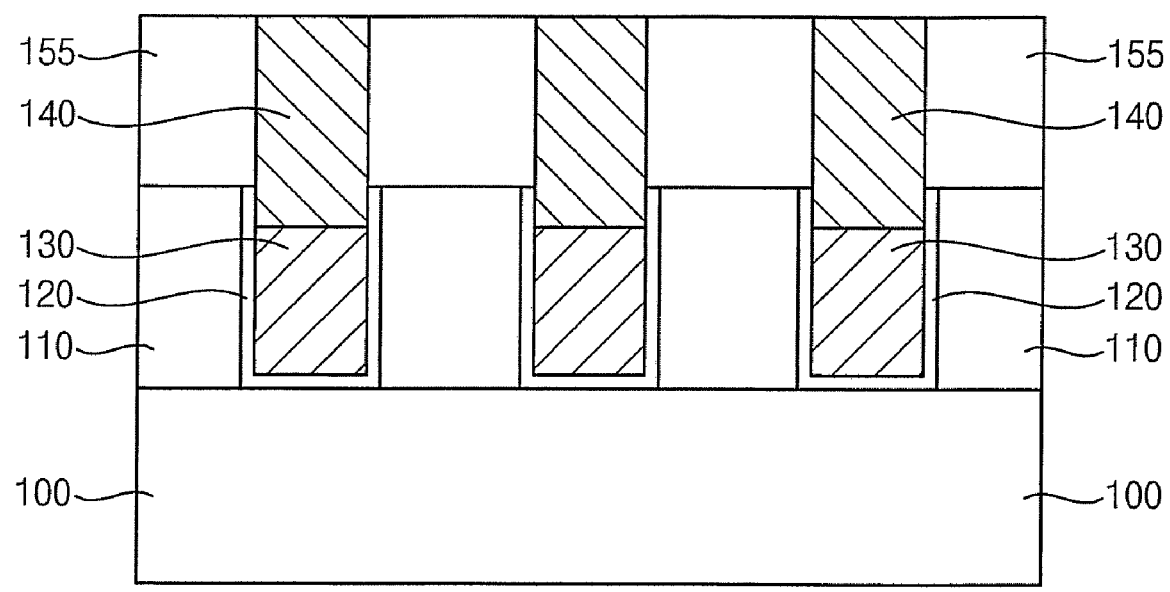

Referring to FIG. 7, the second insulation layer 150 is planarized by a CMP process until the second contact 140 is exposed to form a second insulation layer pattern 155. As mentioned above, the second contact 140 may include the first portion and the second portion. The first portion may be formed by consuming tungsten in the first contact 130 by the oxidation process. The second portion may be formed by growing the tungsten oxide layer by the oxidation process. Accordingly, the first portion may be positioned in the first insulation layer pattern 110 and the second portion may be positioned in the second insulation layer patter 155.

FIG. 8 is an electron microscope image showing a contact structure formed by processes illustrated in FIGS. 4 to 6, and FIG. 9 is an electron microscope image showing a contact structure formed by processes illustrated in FIGS. 4 to 7.

Figure 9:
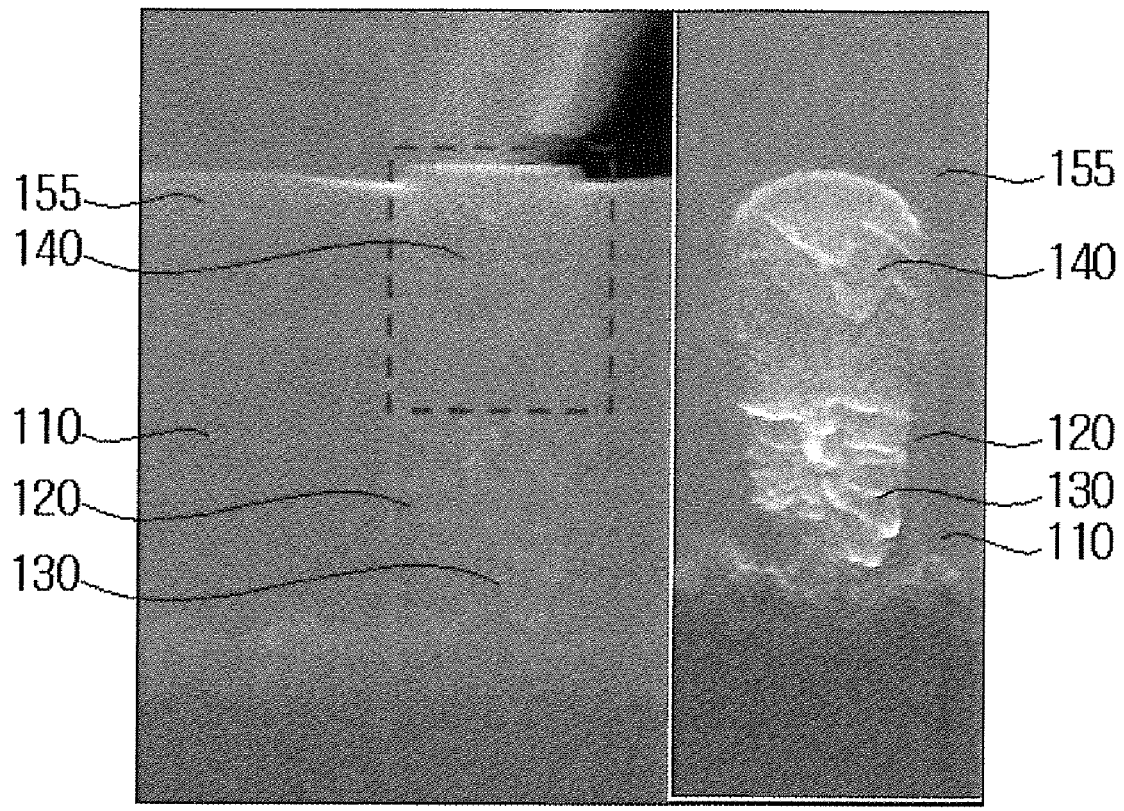

FIGS. 8 and 9 represent the second contact 140 grown from the first contact 130. In FIG. 8, a dotted line represents the upper face of the barrier layer 120. Further, a dotted line in FIG. 9 represents the second contact 140. As illustrated in FIGS. 8 and 9, it may be seen that the upper face of the first contact 130 may be substantially lower than the upper face of the barrier layer 120. Accordingly, a lower portion of the second contact 140 may be positioned in the barrier layer 120 and the first insulation layer pattern 110, and upper portion of the second contact 140 may be positioned in the second insulation layer 150.

The second contact 140 may be formed by growing a tungsten oxide layer using tungsten in the first contact 130 as a seed. That is, the second contact 140 may be formed without performing photolithography processes and etching processes for forming a contact hole. Thus, damage caused by misalignments may be prevented and an alignment margin may be increased. Additionally, the second contact 140 may be easily manufactured by simplified processes because the second contact 140 may be formed without photolithography processes and etching processes.

Figure 10:
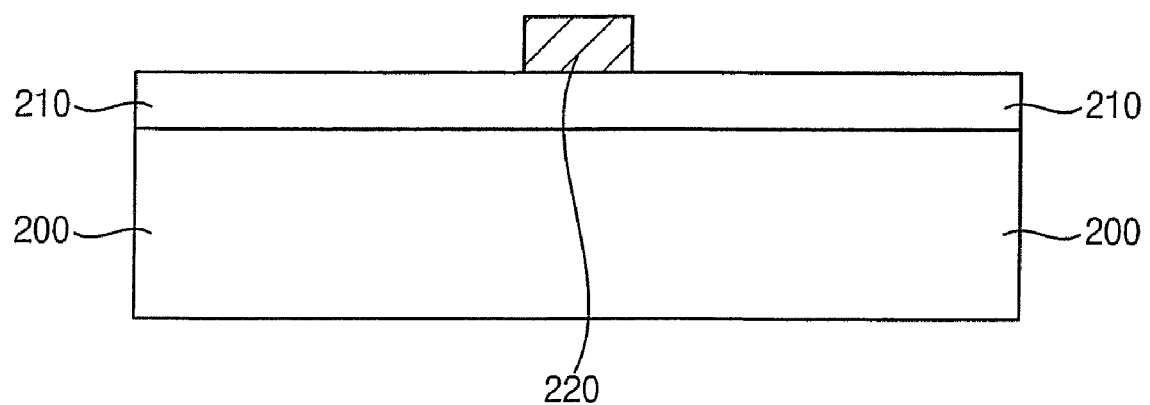
FIGS. 10 to 14 are cross-sectional views illustrating a method of manufacturing a contact structure in accordance with a second embodiment.

FIGS. 10 to 14 are cross-sectional views illustrating a method of forming a contact structure of a second embodiment. Referring to FIG. 10, a first insulation layer 210 is formed on a semiconductor substrate 200. The substrate 200 may include a silicon substrate, a germanium substrate, a silicon-germanium substrate, etc. Alternatively, the substrate 200 may include an SOI substrate or a GOI substrate. The substrate 200 may include a structure (not illustrated) such as an impurity region, a pad, a plug, a contact, a conductive layer pattern, an insulation layer pattern, etc. For example, for a semiconductor memory device such as a dynamic random access memory (DRAM), the substrate 200 may include a gate structure. The first insulation layer 210 may be formed using a material including BPSG, PSG, USG, SOG; FOx, TEOS, PE-TEOS or HDP-CVD oxide by a CVD process, a LPCVD process, a PECVD process or a HDP-CVD process. After forming the first insulation layer 210, the first insulation layer 210 may be planarized by a CMP process. A conductive structure 220 is formed on the first insulation layer 210. The conductive structure 220 may be a bit line.

Figure 11:
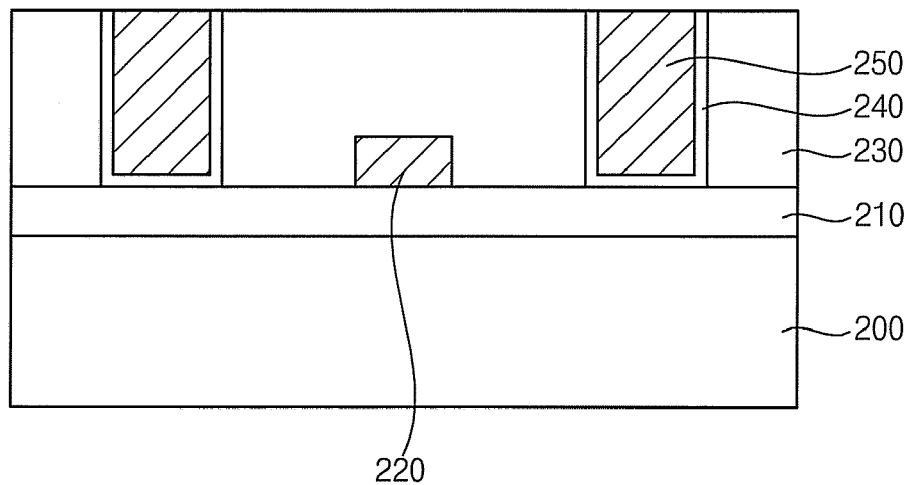

Referring to FIG. 11, a second insulation layer is formed on the first insulation layer 210 to cover the conductive structure 220. The second insulation layer is formed using a material including BPSG, PSG, USG, SOG, FOx, TEOS, PE-TEOS or HDP-CVD oxide by a CVD process, a LPCVD process, a PECVD process or a HDP-CVD process. After forming the second insulation layer, the second insulation layer may be planarized by a CMP process. A first contact hole is formed in the second insulation layer to form a second insulation layer pattern 230 on the first insulation layer 210. The first contact hole may expose the first insulation layer 210 or the substrate 200.

As further illustrated in FIG. 11, a barrier layer 240 is conformally formed along the profile of the first contact hole. The barrier layer 240 may prevent the generation of a high resistance and increase adhesion between the first insulation layer pattern 230 and a first contact 250. The barrier layer 240 may be formed using a metal having a high melting point by a sputtering process. For example, the barrier layer 240 may be formed using titanium (Ti), titanium nitride (TiN), titanium tungsten (TiW), titanium/titanium nitride, tantalum (Ta), tantalum nitride (TaN), etc. A metal layer including tungsten (W) is formed on the barrier layer 240 to fill the first contact hole. The thickness of the metal layer may be adjusted according to type of the semiconductor memory device. For example, the metal layer may have a thickness of about 5,000 Å to about 10,000 Å.

After forming the metal layer, a planarization process may be performed on the metal layer until the second insulation layer pattern 230 is exposed to form the first contact 250 having a convex upper face. The planarization process may include a first CMP process and a second CMP process. The first CMP process may be performed using a first slurry composition which has a substantially higher polishing selectivity with respect to the metal layer than the first insulation layer pattern 230. For example, the first slurry composition may include more than about 2 percent by weight of hydrogen peroxide. The second CMP process may be performed using a second slurry composition which has a substantially higher etch selectivity with respect to the first insulation layer pattern 230 than the metal layer in order to prevent dishing of the first contact 250. For example, the second slurry composition may include less than about 0.5 percent by weight of hydrogen peroxide.

Figure 12:
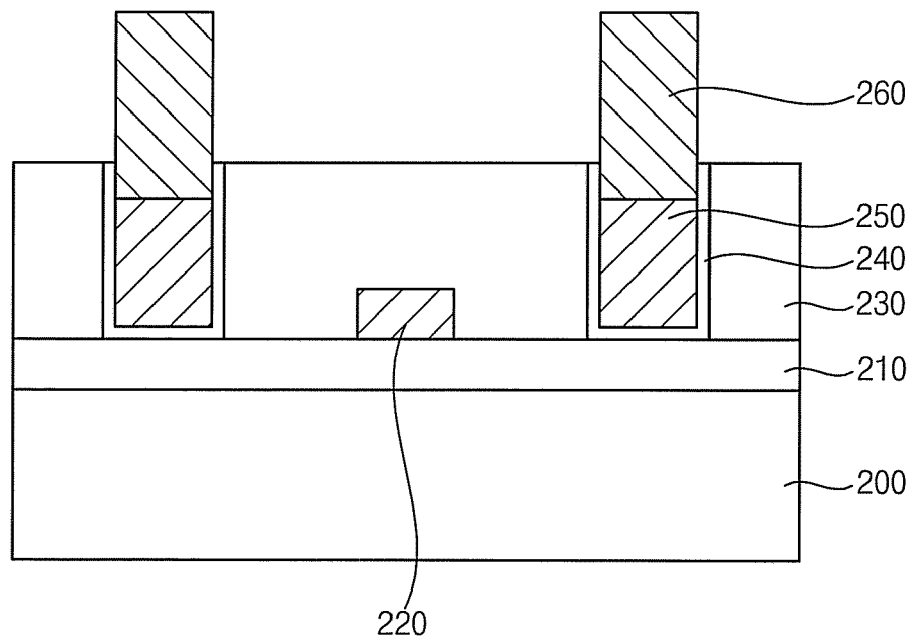

Referring to FIG. 12, a second contact 260 is grown from the first contact 250 by performing an oxidation process. When the oxidation process is performed, a tungsten oxide layer used for the second contact 260 may be upwardly grown from the first contact 250 by the oxidation process using tungsten in the first contact 250 as a seed. A method of forming the tungsten oxide layer used for the second contact 260 has been fully described, so any further explanations in this regard will be omitted herein for brevity.

Figure 13:
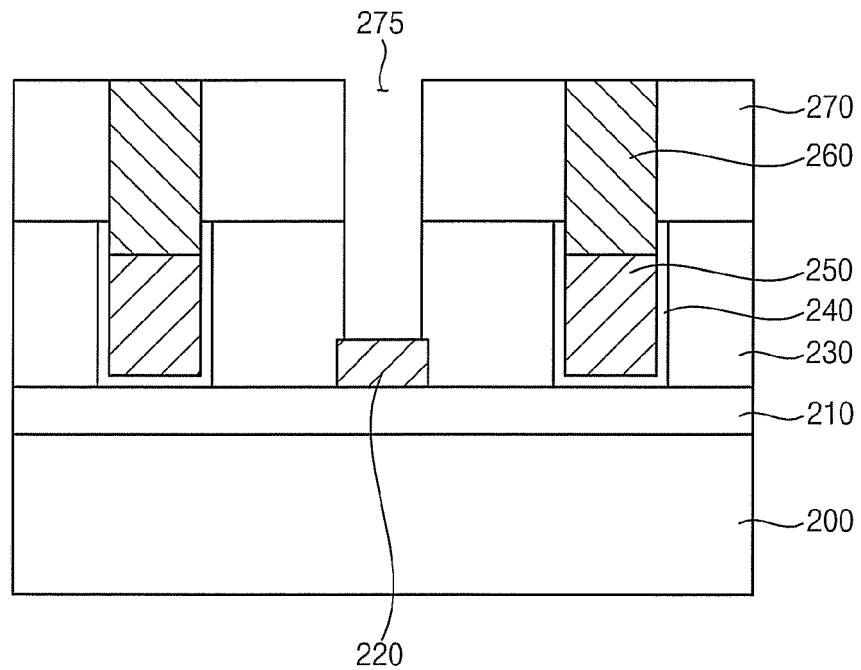

Referring to FIG. 13, a third insulation layer is formed on the second insulation layer pattern 230 to cover the second contact 260. The third insulation layer may be formed using a material including BPSG, PSG, USG, SOG, FOx, TEOS, PE-TEOS or HDP-CVD oxide by a CVD process, a LPCVD process, a PECVD process or a HDP-CVD process. The third insulation layer may be formed using a material substantially the same as the second insulation layer pattern 230 or the first insulation layer 210. After forming the third insulation layer, the second insulation layer may be planarized by a CMP process.

A second contact hole 275 is formed in the third insulation layer to form the third insulation layer pattern 270. The second contact hole 275 may be formed through the third insulation layer and the second insulation layer pattern 230 to expose the conductive structure 220. The second contact hole 275 may be formed by a photolithography process. In formation of the second contact hole 275, a mask (not illustrated) may be formed on the third insulation layer pattern 270. The mask may expose a portion of the third insulation layer pattern 270 corresponding to the conductive structure 220. After forming the second contact hole 275, the mask may be removed from the third insulation layer pattern 270.

Figure 14:
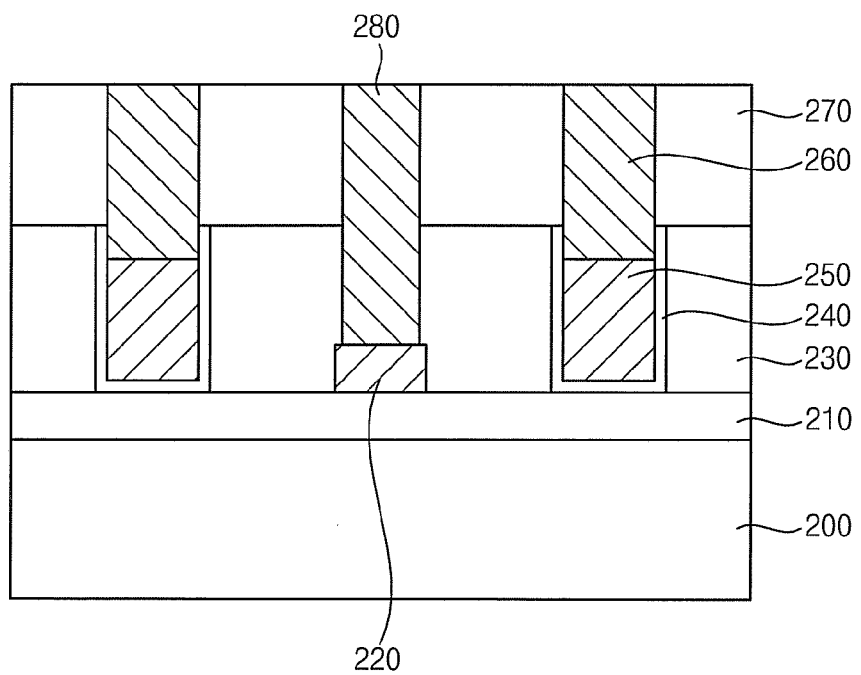

Referring to FIG. 14, a conductive layer is formed on the third insulation layer pattern 270 to fill the second contact hole 275. Then, a planarization process may be performed until the third insulation layer pattern 270 is exposed to form a third contact 280. As a result, the contact structure including the first to third contacts 250, 260 and 280 may be formed in the third insulation layer pattern 270. The conductive layer may be formed using a material having a lower resistance than that of the second contact 260. For example, the conductive material may be formed using tungsten or aluminum.

The second contact 260 included in the contact structure may be formed without performing a photolithography process. Accordingly, damage caused by misalignments may be prevented and an alignment margin may be increased. Additionally, the contact structure may be easily manufactured by simplified processes because the second contact 260 may be formed without photolithography processes and etching processes.

FIGS. 15 to 20 are cross-sectional views illustrating a method of forming a contact structure of a third embodiment. The method of forming the contact structure illustrated in FIGS. 15 to 20 may be applied for a contact structure, in which a low resistance is required, such as a via contact.

Figure 15:
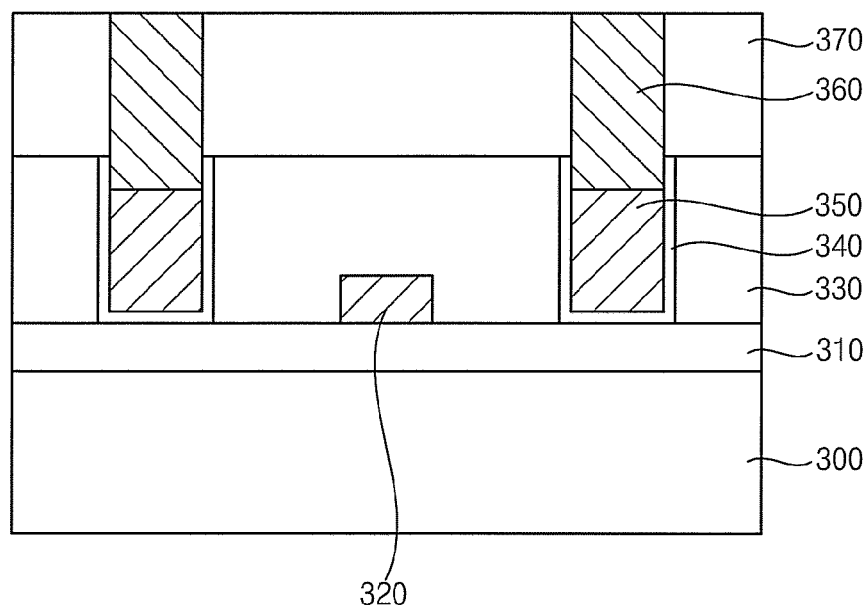
FIGS. 15 to 20 are cross-sectional views illustrating a method of manufacturing a contact structure in accordance with a third embodiment.

Referring to FIG. 15, a first contact 350 and a second contact 360 are formed on the substrate 300 including a first insulation layer 310 and a conductive structure 320. The first and second contacts 350 and 360 may be formed by a method substantially the same as or similar to a method illustrated with reference FIGS. 10 to 13. Thus, any further detailed description of the processes for forming the first and second contacts 350 and 360 will be omitted in order to avoid redundancy.

Figure 16:
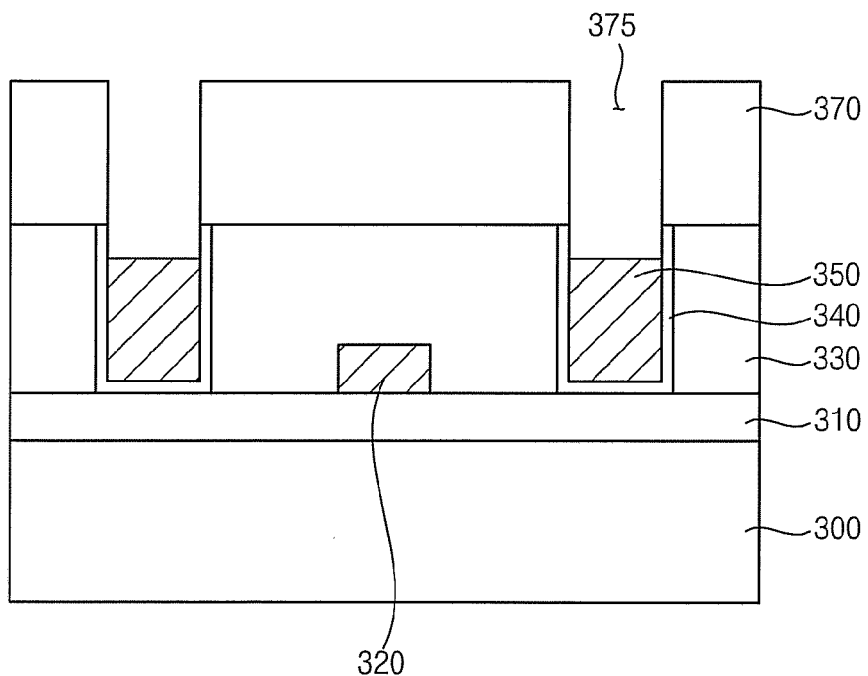

Referring to FIG. 16, the second contact 360 is removed from a third insulation layer pattern 370 to form a third contact hole 375. The third contact hole 375 may expose the first contact 350 and an upper sidewall of a first barrier layer 340. In example embodiment, the second contact 360 may be removed by an etching process, for example, an etch-back process. The third contact hole 375 may be positioned in a second insulation layer pattern 330 and the third insulation layer pattern 370. Further, the first barrier layer 340 may enclose a lower portion of the third contact hole 375.

The third contact hole 375 may be formed without performing a conventional photolithography process. The third contact hole 375 may be formed by removing the second contact 360 which is grown by an oxidation process. That is, the third contact hole 375 may be formed by a self-aligned process so that misalignments may not be generated.

Figure 17:
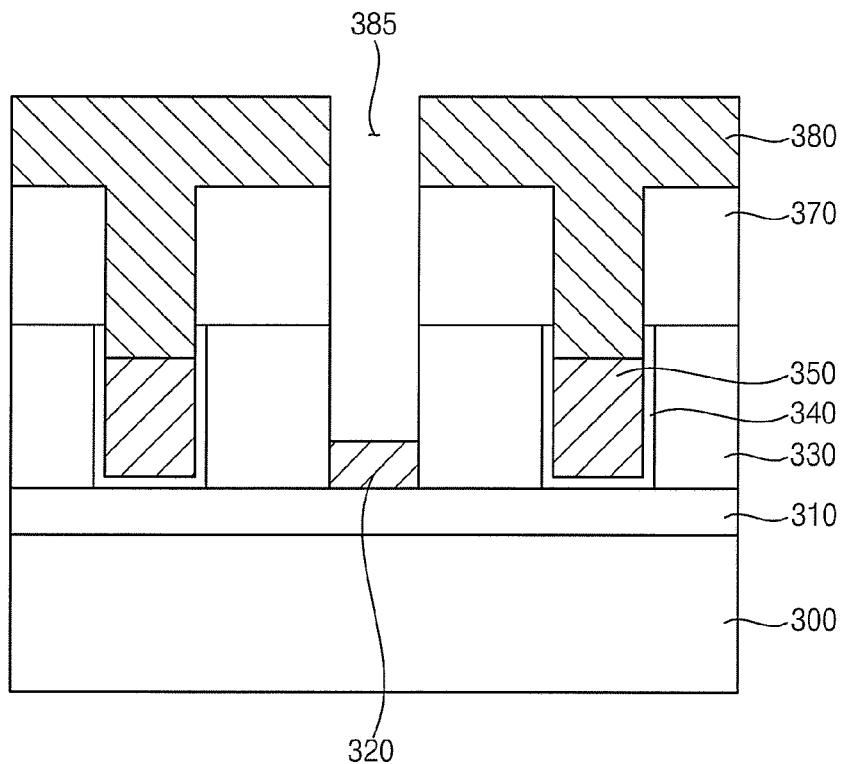

Referring to FIG. 17, a fourth contact hole 385 is formed to expose the conductive structure 320. The fourth contact hole 385 may be formed by a photolithography process. In formation of the fourth contact hole 385, a mask 380 is formed on the third insulation layer pattern 370. The mask 380 may cover the third contact hole 375 and expose a portion of the third insulation layer pattern 370 corresponding to the fourth contact 385. An etching process may be performed using the mask 380 as an etching mask to form the fourth contact hole 385 in the second and third insulation layer patterns 330 and 370. Although the fourth contact hole 385 may have a high aspect ratio, the fourth contact hole 385 may be efficiently formed because third contact hole 375 is formed by the self-aligned process without misalignments.

Figure 18:
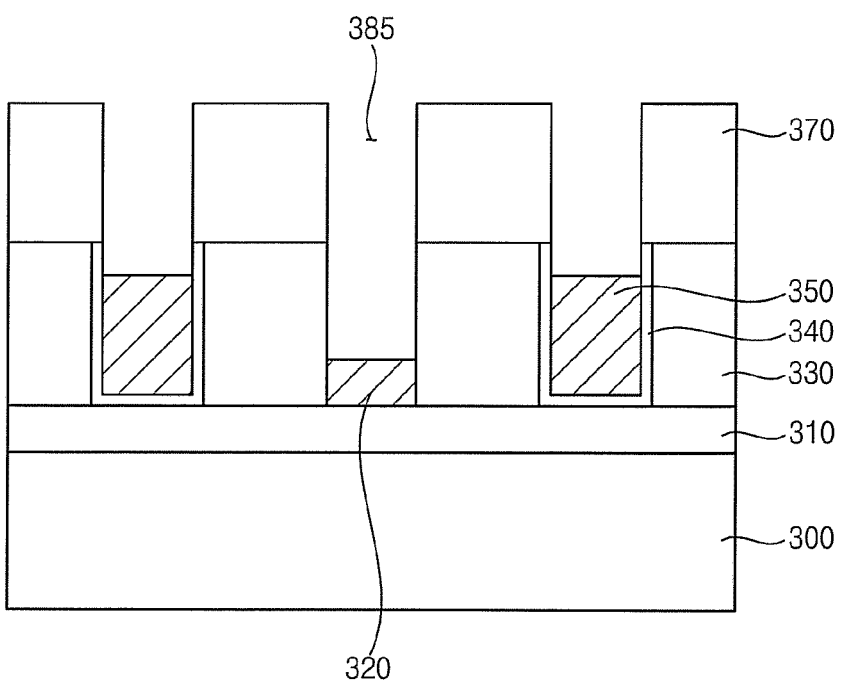

Referring to FIG. 18, the mask 380 is removed to expose the third and fourth contact holes 375 and 385.

Figure 19:
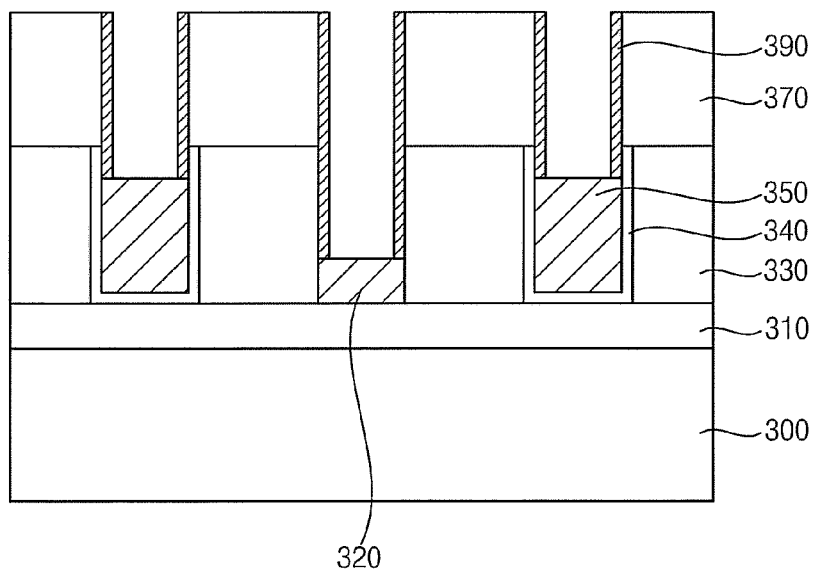

Referring to FIG. 19, a second barrier layer 390 is conformally formed along the profile of the third and fourth contact holes 375 and 385. The second barrier layer 390 may be formed using a metal having a high melting point by a sputtering process. The barrier layer 390 may be formed using titanium (Ti), titanium nitride (TiN), titanium tungsten (TiW), titanium/titanium nitride, tantalum (Ta), tantalum nitride (TaN), etc. For example, the barrier layer 390 may have a thickness of about 100 Å. Then, the barrier layer 390 contacting with the first contact 350 and the conductive structure 320 is removed to expose the first contact 350 and the conductive structure 320.

Figure 20:
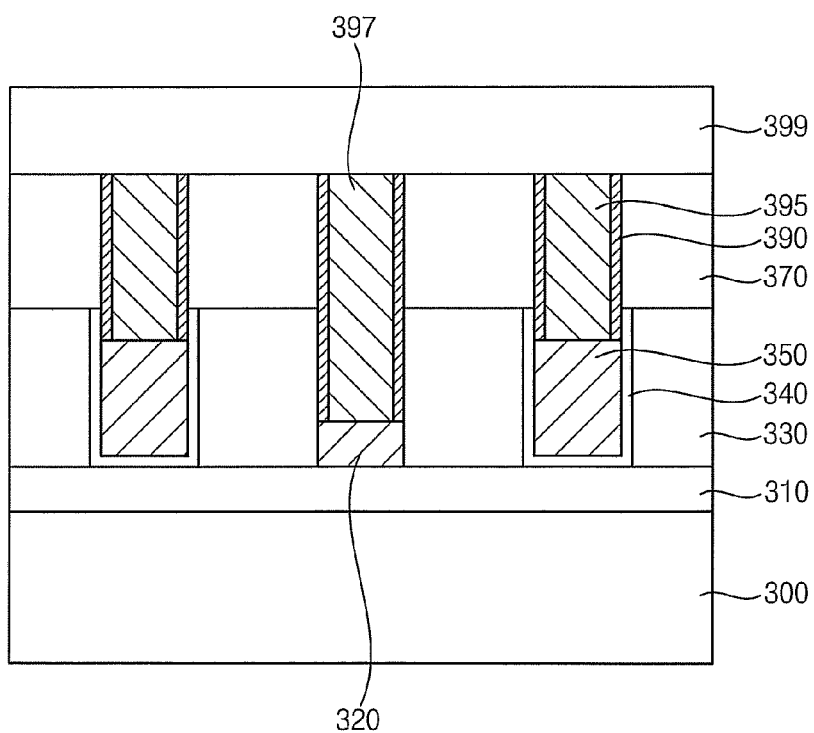

Referring to FIG. 20, a conductive layer is formed on the third insulation layer pattern 370 to fill the third and fourth contact holes 375 and 385. When a low resistance is required, the conductive layer may be formed using a material having a lower resistance than tungsten oxide. For example, the conductive layer may be formed using a material including tungsten or aluminum. The conductive layer may be planarized until the third insulation layer pattern 370 is exposed to form a third contact 395 and a fourth contact 397. The third contact 395 is electrically connected to the first contact 340 and the fourth contact 397 is electrically connected to the conductive structure 320. Additional layers may be formed on the third insulation layer pattern 370 and the third and fourth contacts 395 and 397. In example embodiments, a protection layer 399 may be formed on the third insulation layer pattern 370 and the third and fourth contacts 395 and 397.

According to example embodiments, the third contact hole 375 may be efficiently formed on the first contact 350 without performing photolithography processes to have a high alignment margin. Additionally, the third contact hole 375 may be easily formed by simplified processes because the third contact hole 375 may be formed without photolithography processes.

Hereinafter, a method of manufacturing a semiconductor device according to a example embodiments will be explained in detail with reference to the accompanying drawings, wherein FIGS. 21 to 40 are cross-sectional views illustrative thereof. Although FIGS. 21 to 40 illustrate a method of manufacturing a flash memory device, the features and advantages of the invention may be employed in other non-volatile semiconductor devices or volatile semiconductor devices. First transistors such as cell transistors may be formed in a first area I of a substrate 400, and second transistors such as high voltage transistors may be formed in a second area II of the substrate 400.

Figure 21:
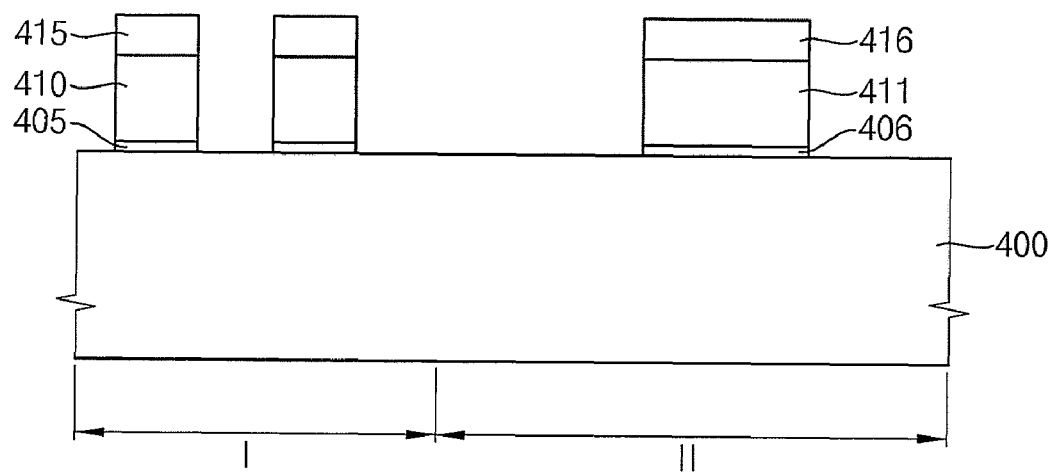
FIGS. 21 to 40 are cross-sectional views illustrating a method of manufacturing a semiconductor device in accordance with a further embodiment.

Referring to FIG. 21, a first insulation layer is formed on the substrate 400 having the first and the second areas I and II. The substrate 400 may include a semiconductor substrate such as a single crystalline silicon substrate, a single crystalline germanium substrate, a silicon-germanium substrate, etc. Alternatively, the substrate 400 may include an SOI substrate, a GOI substrate, etc. The first insulation layer may include an oxide and/or a metal oxide by a radical oxidation process, a CVD process, an atomic layer deposition (ALD) process, a sputtering process, a pulsed laser deposition (PLD) process, etc. When the first insulation layer is obtained by the radical oxidation process, the first insulation layer 405 may sufficiently ensure a desired structure and electrical characteristics for the tunnel insulation layer in the flash memory device. Also, impurities may be doped into the first and the second areas I and II of the substrate 400 to form desired wells at predetermined portions of the substrate 400 considering electrical characteristics of the cell transistors and the high voltage transistors. For example, p-type and n-type impurities may be implanted into the first and second areas I and II of the substrate 400 to form a p-type well and an n-type well in the first area I and the second area II, respectively.

A first conductive layer is formed on the first insulation layer. The first conductive layer may be formed using polysilicon, a metal and/or a metal compound by a CVD process, an ALD process, a PECVD process, a sputtering process, a PLD process, an evaporation process, etc. The first conductive layer may be formed by a PECVD process using polysilicon doped with impurities when the flash memory device is formed on the substrate 400. The first conductive layer may have a multilayer structure having a thickness of about 500 Å to about 1,500 Å measured from an upper face of the first insulation layer. In the formation of the first conductive layer, a first conductive film may be formed on the first insulation layer, and then a second conductive film may be formed on the first conductive film. Here, the first conductive film may have a thickness of about 200 Å to about 500 Å, and the second conductive film may have a thickness of about 300 Å to about 1,000 Å.

A hard mask layer is provided on the first conductive layer. The hard mask layer may be formed using a material that has an etch selectivity relative to the first conductive layer, the first insulation layer and the substrate 400. For example, the hard mask layer may include silicon nitride, silicon oxynitride, titanium oxynitride, etc. Alternatively, the hard mask layer may have a multilayer structure that includes an oxide film, a nitride film, an organic material film and/or an oxynitride film. For example, the hard mask layer may include an oxide film, a lower nitride film, an organic material film and an upper nitride film.

Referring to FIG. 21, a first hard mask 415 and a second hard mask 416 are formed on the first conductive layer by partially etching the hard mask layer. The first hard mask 415 is positioned in the first area I of the substrate 400, whereas the second hard mask 416 is located in the second area II of the substrate 400. The second hard mask 416 may have a width substantially larger than that of the first hard mask 415 when a high voltage transistor is formed in the second area II of the substrate 400. In formation of the first and second hard masks 415 and 416, a mask such as a photoresist pattern may be formed on the hard mask layer. The hard mask layer may be patterned using the mask as an etching mask to form the first and second hard masks 415 and 416.

The first conductive layer and the first insulation layer are partially etched using the first and the second hard masks 415 and 416 as etching masks, so that a floating gate 410, a lower electrode 411, a tunnel insulation layer pattern 405 and a gate insulation layer pattern 406 are formed on the substrate 400. The tunnel insulation layer pattern 405 and the floating gate 410 are formed in the first area I, and the gate insulation layer pattern 406 and the lower electrode 411 are disposed in the second area II. Thus, a first conductive structure and a second conductive structure are provided in the first area I and the second area II, respectively. The first conductive structure includes the tunnel insulation layer pattern 405, the floating gate 410 and the first hard mask 415. The second conductive structure has the gate insulation layer pattern 406, the lower electrode 411 and the second hard mask 416. The tunnel insulation layer pattern 405 and the floating gate 410 may have widths substantially smaller than those of the gate insulation layer pattern 406 and the lower electrode 411, respectively. Further, the floating gate 410 and the lower electrode 411 may be simultaneously formed by performing one etching process although the floating gate 410 may have dimensions substantially different from those of the lower electrode 411. Adjacent first conductive structures in the first area I may be disposed at an interval substantially smaller that an interval between adjacent second conductive structures in the second area II.

Figure 22:
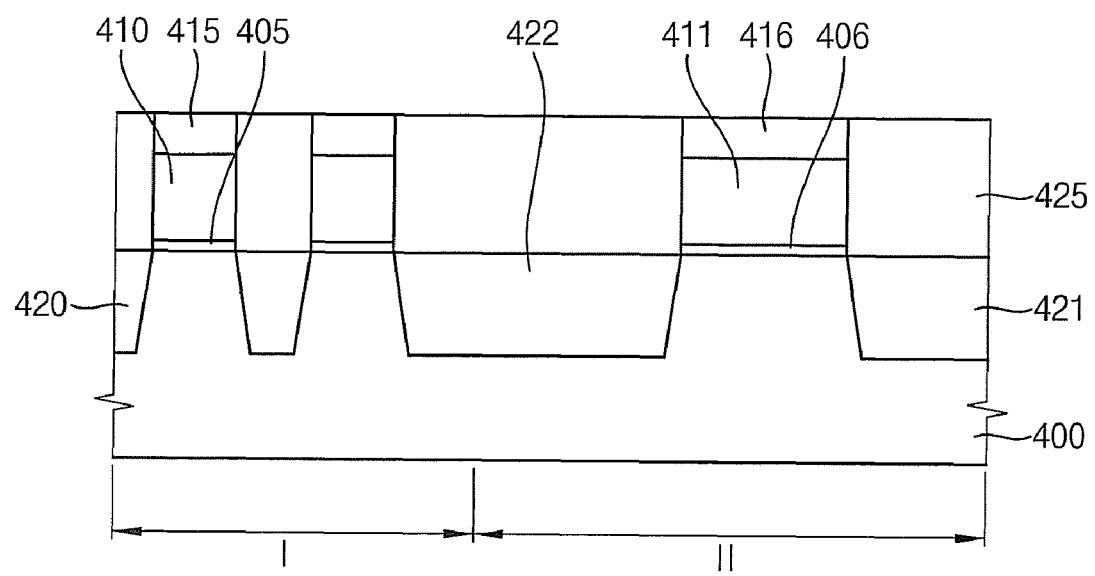

Referring to FIG. 22, the substrate 400 is partially etched using the first and the second conductive structures as etching masks, such that a first trench (not illustrated), a second trench (not illustrated), and a third trench (not illustrated) are formed on the substrate 400. The first trench may be disposed between adjacent first conductive structures, and the second trench may be formed between adjacent second conductive structures. Further, the third trench may be disposed between the first area I and the second area II. That is, the third trench is formed between an outermost first conductive structure and an outermost second conductive structure. The second trench may have a width substantially larger than that of the first trench and the third trench may have a width substantially the same as or substantially similar to that of the second trench. However, the first trench may have a depth substantially the same as or substantially similar to those of the second and the third trenches. Each of the first to the third trenches may have a depth of about 2,000 Å to about 4,000 Å measured from the upper face of the substrate 400.

A first isolation layer 420, a second isolation layer 421 and a third isolation layer 422 are formed on the substrate 400 to fill up the first trench, the second trench and the third trench, respectively. Each of the first to the third isolation layers 420, 421 and 422 may be formed using an oxide by a shallow trench isolation (STI) process, a thermal oxidation process, a CVD process, an HDP-CVD process, etc. The first isolation layer 420 may electrically insulate adjacent cell transistors in the first area L and the second isolation layer 421 may electrically insulate adjacent high voltage transistors in the second area II. The third isolation layer 422 may electrically insulate the cell transistor from the high voltage transistor between the first and the second areas I and II.

Field impurities may be doped into portions of the substrate 400 where the first to the third trenches are formed before forming the first to the third trenches on the substrate 400. Hence, electrical insulation characteristics of the first to the third isolation layers 420, 421 and 422 may be enhanced due to the field impurities.

After a second insulation layer 425 is formed on the substrate 400 to cover the first and the second conductive structures, the second insulation layer 425 is partially etched until the first and the second hard masks 415 and 416 are exposed. The second insulation layer 425 may be formed using silicon oxide by a CVD process, an LPCVD process, a spin coating process, a PECVD process, an HDP-CVD process, etc. The second insulation layer 425 may be partially removed by a CMP process and/or an etch-back process.

Figure 23:
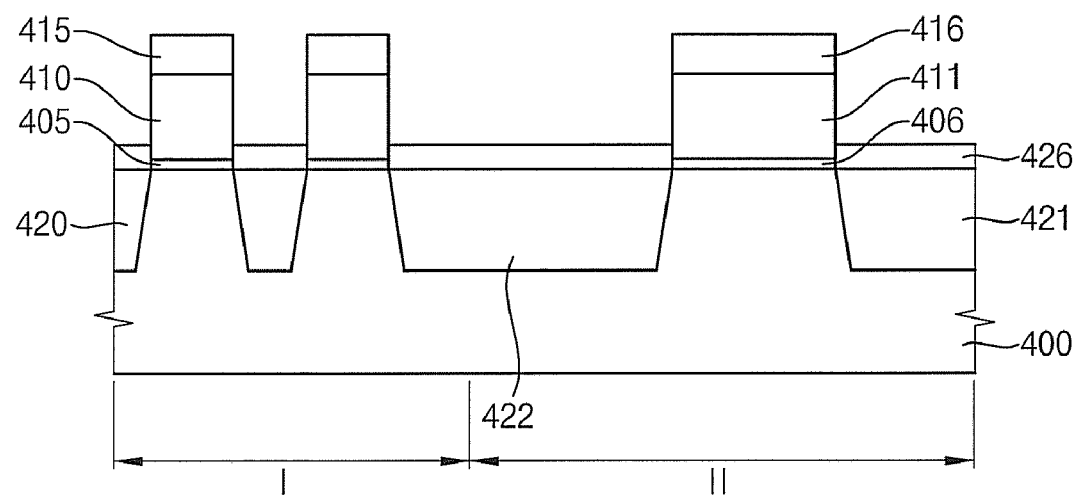

Referring to FIG. 23, the second insulation layer 425 is etched to form an upper insulation layer 426 on the substrate 400. The upper insulation layer 426 covers lower sidewalls of the floating gate 410 and the lower electrode 411, and may cover the third isolation layer 422 between the first and the second areas I and II. After the formation of the upper insulation layer 426, sidewalls of the first and the second conductive structures may be exposed.

Figure 24:
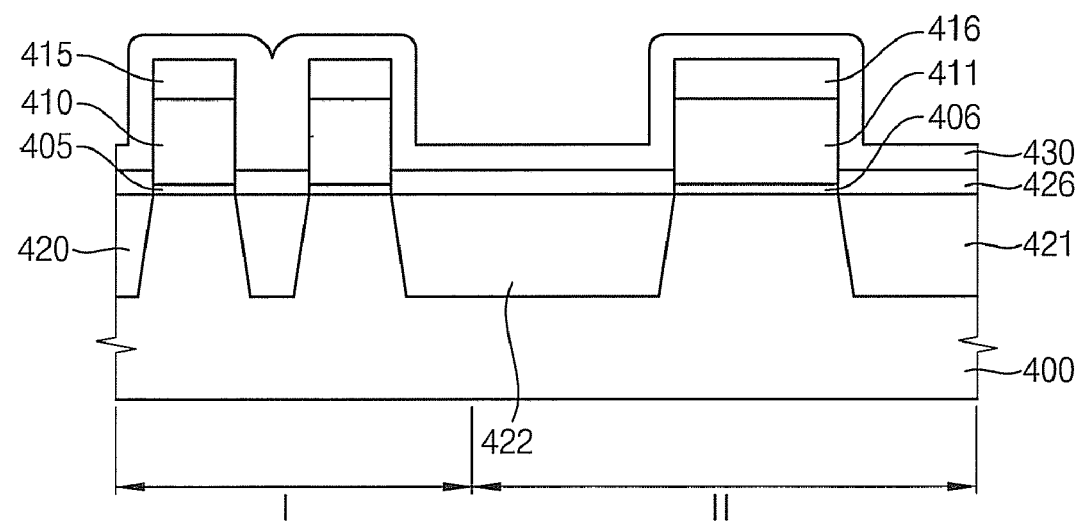

Referring to FIG. 24, a spacer formation layer 430 is formed on the upper insulation layer 426 to cover the first and the second conductive structures. The spacer formation layer 430 may be formed using middle temperature oxide (MTO) or silicon oxynitride by a CVD process, an LPCVD process, a PECVD process, an HDP-CVD process, etc. A gap between adjacent first conductive structures may be filled with the spacer formation layer 430 when the spacer formation layer 430 has a sufficient thickness substantially larger than half of a width of the gap between adjacent first conductive structures. When the spacer formation layer 430 fills up the gap between adjacent first conductive structures, a recess 434 (see FIG. 25) is formed between the first area I and the second area II while etching the spacer formation layer 430.

Figure 25:
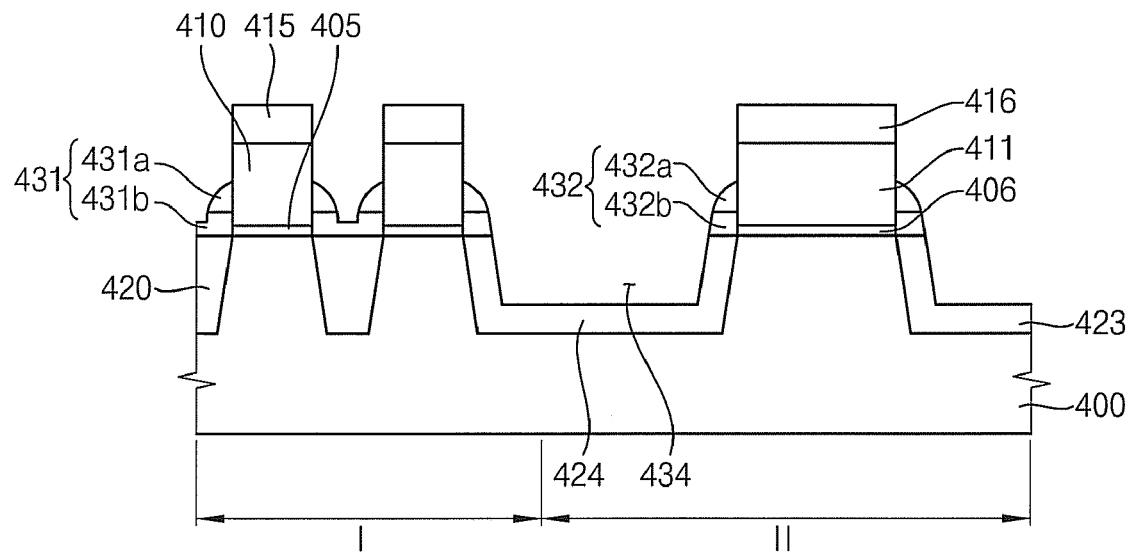

Referring to FIG. 25, the spacer formation layer 430 and the upper insulation layer 426 are anisotropically etched to form a first spacer 431, a second spacer 432 and the recess 434. When the spacer formation layer 430 and the upper insulation layer 426 are etched, the upper insulation layer 426 remains on the first isolation layer 420 so that the first isolation layer 420 is not etched because the spacer formation layer 430 between the first conductive structures has relatively larger height from the upper insulation layer 426. However, the second and third isolation layers 421 and 422 are etched to form the recess 434 because the spacer formation layer 430 in the second area II and between the first and second areas I and II may have a relatively lower height from the upper insulation layer 426.

The first and the second spacers 431 and 432 are positioned to enclose the lower sidewalls of the first and the second conductive structures, respectively. The first spacer and second spacers 431 and 432 may include lower portions 431b and 432b, respectively, which are formed by etching the upper insulation layer 426. Further, the first spacer and second spacers 431 and 432 may include upper portions 431a and 432a, respectively, which are formed by etching the space formation layer 430.

In the etching of the spacer formation layer 430, the second isolation layer 421 and the third isolation layer 422 are partially etched, such that a second isolation layer pattern 423 and a third isolation layer pattern 424 are formed in the second trench and the third trench, respectively. The second and the third isolation layer patterns 423 and 424 may be positioned on lower faces and sidewalls of the second and the third trenches, respectively. A buried shielding structure 473 (see FIG. 33) will be formed in the recess 434 in a subsequent process, and thus leakage currents may be reduced to improve operation characteristics of the flash memory device.

The first and second spacers 431 and 432 in FIG. 25 may increase a coupling ratio of the flash memory device. The coupling ratio of the flash memory device may mainly depend on the amount of charge between the floating gate 410 and a control gate structure 470 (see FIG. 32) of the flash memory device. Hence, the coupling ratio of the flash memory device may increase in accordance with the increase of the area between the floating gate 410 and the control gate structure 470. When the first and second spacers 431 and 432 are positioned on the lower sidewalls of the first and the second conductive structures, the flash memory device may have an increased coupling ratio compared to that of the conventional flash memory device.

Figure 26:
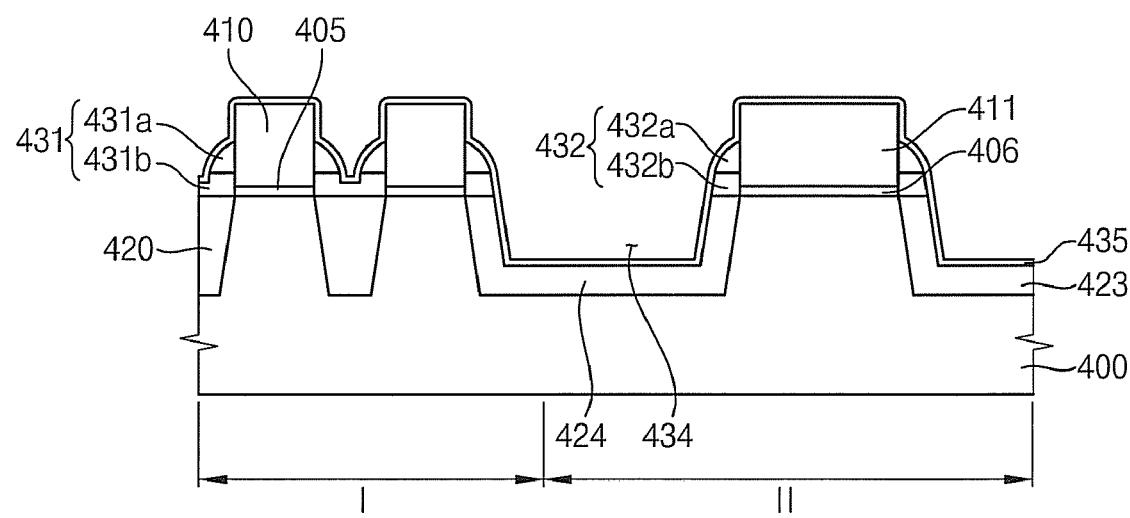

Referring to FIG. 26, a dielectric layer 435 is formed on the resultant structures to cover the floating gate 410 and the lower electrode 411 after removing the first and second masks 415 and 416 from the floating gate 410 and the lower electrode 411. The dielectric layer 435 further covers the first spacer 431, the second spacer 432, the second isolation pattern 423, and the third isolation layer pattern 424. The dielectric layer 435 may be conformally formed on the resultant structures. The dielectric layer 435 may be formed using a material that increases the coupling ratio of the flash memory device. When the dielectric layer 435 includes a material having a dielectric constant substantially larger than those of the tunnel insulation layer pattern 405 and the gate insulation layer pattern 406, the flash memory device may have a considerably increased coupling ratio. For example, the dielectric layer 435 may be formed using a metal compound such as hafnium oxide (HfOx), aluminum oxide (AlOx), tantalum oxide (TaOx), zirconium oxide (ZrOx), etc. Alternatively, the dielectric layer 435 may have a multilayer structure that includes a lower oxide film, a nitride film and an upper oxide film. The dielectric layer 435 may have a thickness of about 100 Å to about 200 Å.

Figure 27:
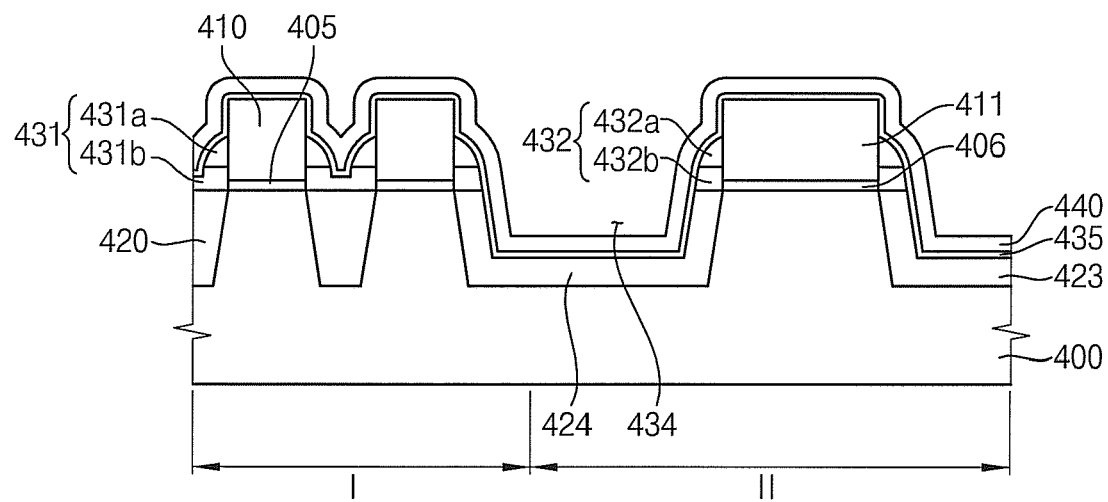

Referring to FIG. 27, a second conductive layer 440 is formed on the dielectric layer 435. The second conductive layer 440 may also be conformally formed on the dielectric layer 435 along the profiles of the resultant structures on the substrate 400. The second conductive layer 440 may be formed using polysilicon, a metal and/or a metal compound by a CVD process, an ALD process, a PECVD process, a sputtering process, a PLD process, an evaporation process, etc. The second conductive layer 440 may have a thickness of about 500 Å to about 1,000 Å based on an upper face of the dielectric layer 435.

Figure 28:
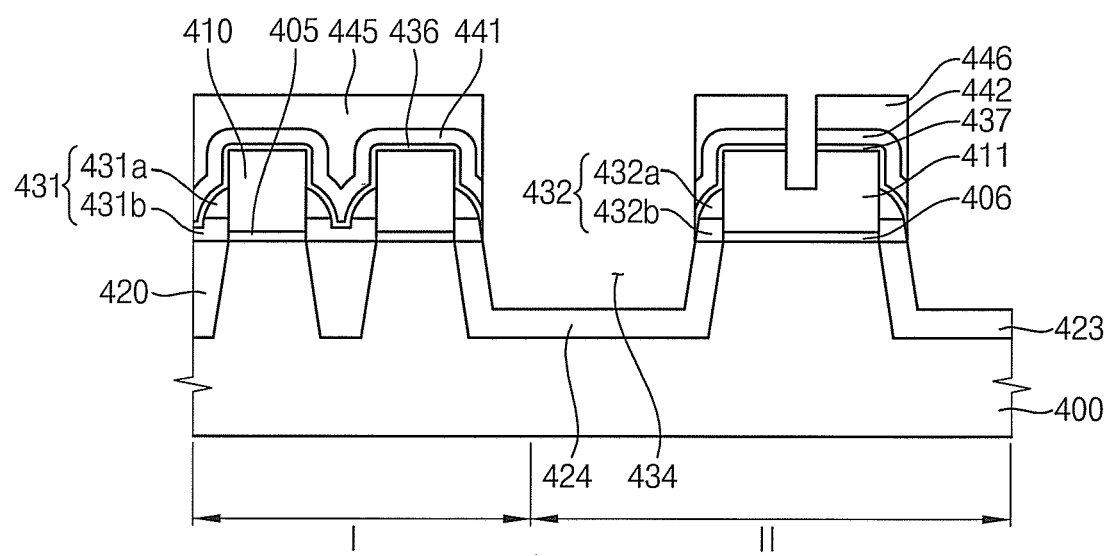

Referring to FIG. 28, a first butting mask 445 and a second butting mask 446 are provided on the second conductive layer 440 in the first and the second areas I and II, respectively. The first butting mask 445 covers the first conductive structures in the first area I, and the second butting mask 446 partially covers the second conductive structures in the second area II. A central portion of the second conductive structure is exposed through the second butting mask 446, so that a portion of the second conductive layer 440 is exposed by the second butting mask 446. Further, a portion of the second conductive layer 440 between the first and the second areas I and II is exposed after formations of the first and the second butting masks 445 and 446. That is, a portion of the second conductive layer 440 positioned over the third isolation layer pattern 424 is exposed when the first and the second butting masks 445 and 446 are formed.

The second conductive layer 440 and the dielectric layer 435 are etched using the first and the second butting masks 445 and 446 as etching masks. Additionally, portions of the second conductive layer 440, the dielectric layer 435 and the lower electrode 411 in the second area II are etched while partially removing the second conductive layer 440 and the dielectric layer 435. Hence, a first dielectric layer pattern 436 and a first control gate 441 are formed in the first area I, and a second dielectric layer pattern 437 and a first upper electrode 442 are formed in the second area II. When the lower electrode 411 is partially etched, a dent or a recess may be provided on the lower electrode 411.

The first dielectric layer pattern 436 may cover the floating gate 410 and the first spacer 431 in the first area I. Further, the first dielectric layer pattern 436 may cover all of the floating gates and the first spacers in the first area I. That is, the cell transistors in the first area I may share one common first dielectric layer pattern 436. Similarly, the cell transistors may also share one first control gate 441 formed on the first dielectric layer pattern 436. However, the high voltage transistors in the second area II may not share one common dielectric layer pattern. That is, the second dielectric layer pattern 437 may be separated from adjacent second dielectric layer pattern. The second dielectric layer pattern 437 may cover the second spacer 432 and the lower electrode 411, and the first upper electrode 442 may be positioned on the second dielectric layer pattern 437. In the reading and erasing operations of the flash memory device, the charges may not be stored into the lower electrode 411 of the second conductive structure, so that the lower electrode 411 and the first upper electrode 442 may make contact with upper electrodes successively formed.

Figure 29:
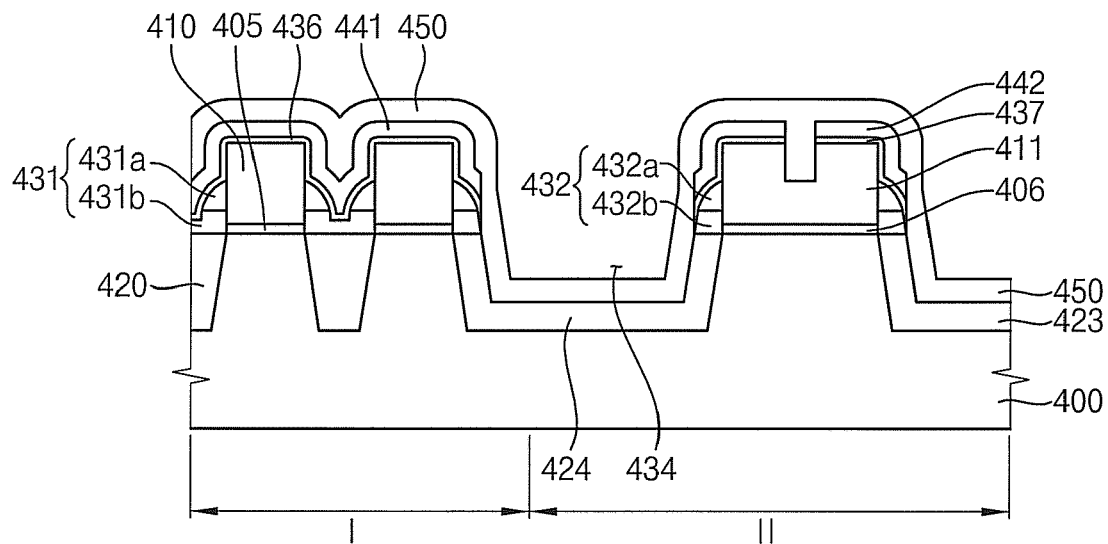

Referring to FIG. 29, after the first and the second butting masks 445 and 446 are removed from the first control gate 441 and the first upper electrode 442, a third conductive layer 450 is formed on the first control gate 441, the third isolation layer pattern 424 and the first upper electrode 442. The third conductive layer 450 may fill up the dent or the recess exposing the lower electrode 411, and thus the third conductive layer 450 may make contact with the lower electrode 411. The third conductive layer 450 may be formed using polysilicon, a metal and/or a metal compound by a CVD process, an ALD process, a PECVD process, a sputtering process, a PLD process, an evaporation process, etc. The third conductive layer 450 may have a thickness of about 500 Å to about 1,000 Å. The third conductive layer 450 may include a material substantially the same as or substantially similar to that of the second conductive layer 440 and/or that of the first conductive layer 410. Alternatively, the first to the third conductive layers 410, 440 and 450 may be formed using different materials, respectively.

Figure 30:
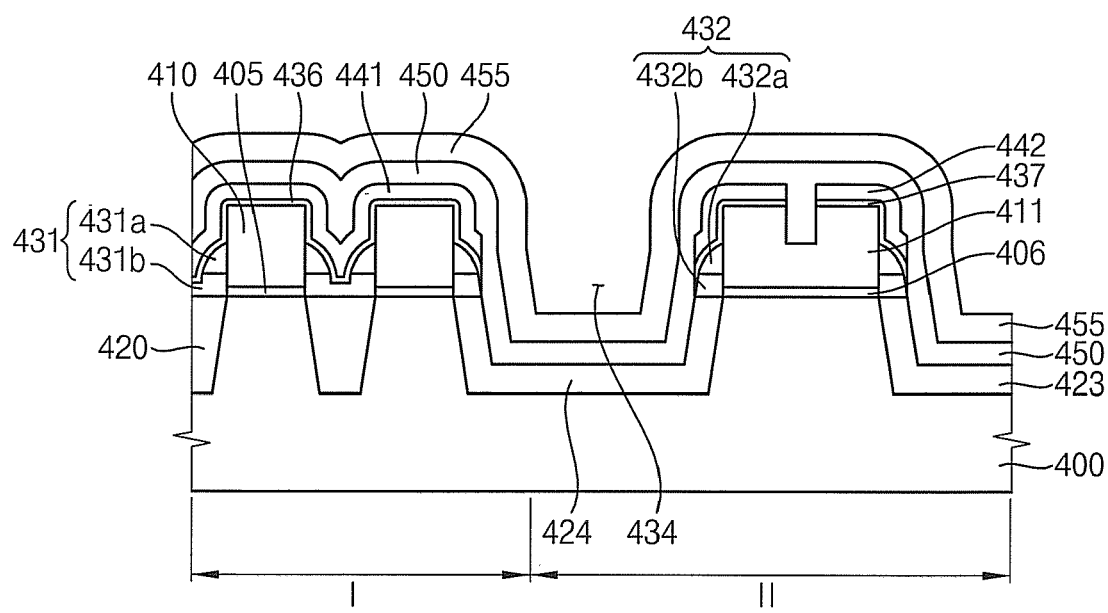

Referring to FIG. 30, a fourth conductive layer 455 is formed on the third conductive layer 450. The third and the fourth conductive layers 450 and 455 may be conformally formed along the profile of the resultant structures on the substrate 400. The fourth conductive layer 455 may be formed using a metal and/or a metal compound by a CVD process, a PECVD process, a sputtering process, a PLD process, an evaporation process, etc. In one example embodiment, the fourth conductive layer 455 may have a multilayer structure that includes a tungsten film and a tungsten silicide film. The fourth conductive layer 455 may have a thickness of about 500 Å to about 1,000 Å based on an upper face of the third conductive layer 450.

A thermal treatment process may be performed about the substrate 400 having the fourth conductive layer 455, the third conductive layer 450 and the lower electrode 411. The thermal treatment process may improve adhesion strength between the fourth conductive layer 455 and the third conductive layer 450, and between the fourth conductive layer 455 and the lower electrode 411. Additionally, contact resistance among the fourth conductive layer 455, the third conductive layer 450 and the lower electrode 411 may be reduced because of the thermal treatment process. The thermal treatment process may be executed at a temperature below about 850° C. under an atmosphere including nitrogen.

Figure 31:
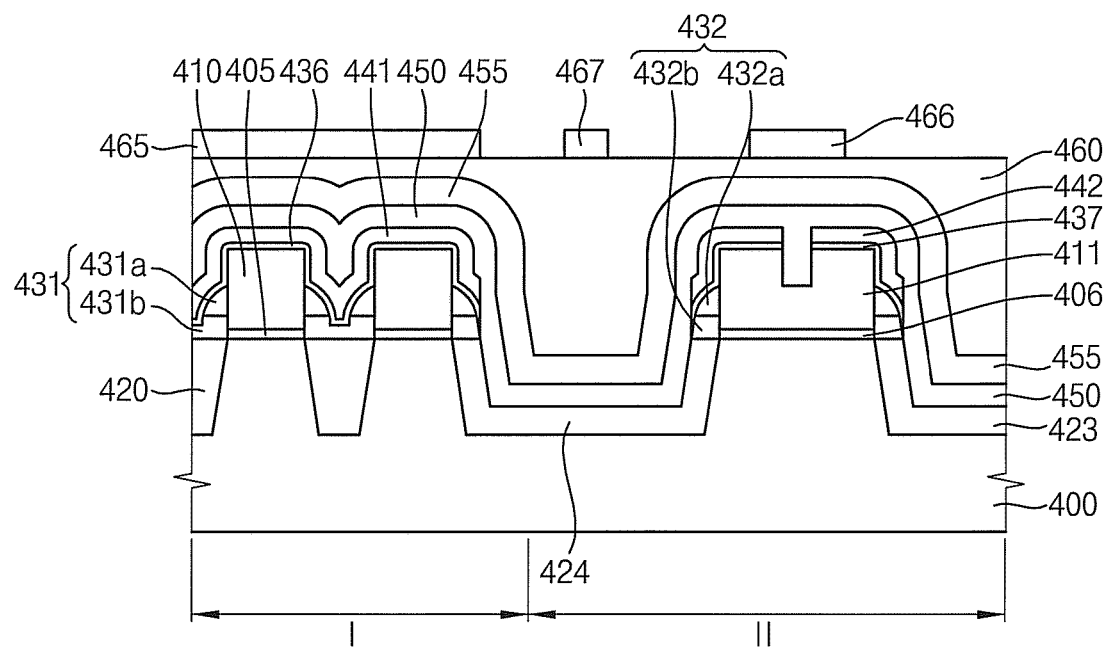

Referring to FIG. 31, a mask layer 460 is formed on the fourth conductive layer 455. The mask layer 460 may have a predetermined thickness to fully fill up the recess 434 positioned over the third isolation layer pattern 424 between the first and the second areas I and II. The mask layer 460 may be formed using an oxide, a nitride and/or an organic material by a CVD process, a PECVD process, an HDP-CVD process, etc. For example, the mask layer 460 may include silicon oxide, silicon nitride, carbon, etc. Mask layer 460 may have a multilayer structure. For example, the mask layer 460 may include an oxide film, a carbon film and a nitride film. Here, the oxide film may have a thickness of about 2,000 Å to about 3,000 Å, and the carbon film may also have a thickness of about 2,000 Å to about 3,000 Å. Further, the nitride film may have a thickness of about 500 Å to about 1,000 Å. The nitride film may also serve as an antireflective layer. The mask layer 460 may be planarized by a planarization process to ensure a level upper face thereof.

A first photoresist pattern 465, a second photoresist pattern 466 and a third photoresist pattern 467 are formed on the mask layer 460. The first photoresist pattern 465 is positioned on a first portion of the mask layer 460 in the first area I, and the second photoresist pattern 466 is formed on a second portion of the mask layer 460 in the second area II. The third photoresist pattern 467 is positioned on a third portion of the mask layer 460 between the first and the second areas I and II.

The first photoresist pattern 465 may have a width substantially larger than that of the second photoresist pattern 466 and that of the third photoresist pattern 467. Further, the second photoresist pattern 466 may have a width substantially wider than that of the third photoresist pattern 467.

Figure 32:
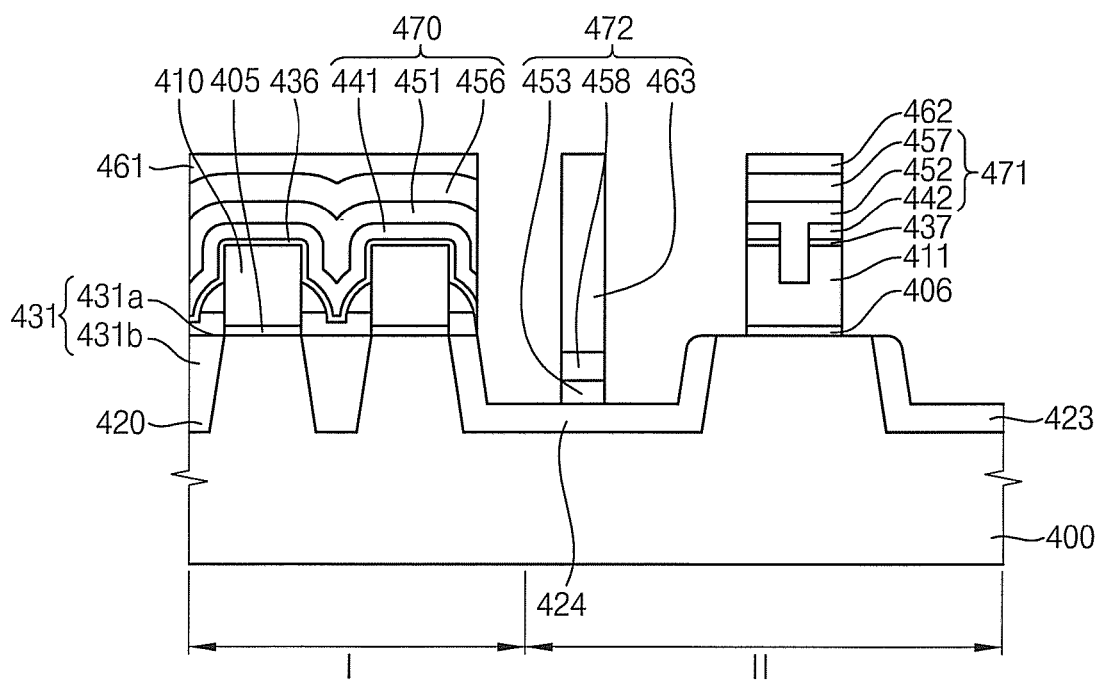

Referring to FIG. 32, the mask layer 460 is etched using the first to the third photoresist patterns 465, 466 and 467 as etching masks. Hence, a first mask 461, a second mask 462 and a third mask 463 are formed on the fourth conductive layer 455. The first mask 461 is formed on a first portion of the fourth conductive layer 455 in the first area I, and the second mask 462 is formed on a second portion of the fourth conductive layer 455 in the second area II. The third mask 463 is formed on a third portion of the fourth conductive layer 455 between the first and the second areas I and II. Therefore, gate structures are provided in the second area II while forming the cell transistors in the first area I. The gate structure includes a first upper electrode 442, the second dielectric layer pattern 437, the lower electrode 411 and the gate insulation layer pattern 406.

In accordance with the dimensions of the first to the third photoresist patterns 465, 466 and 467, the first mask 461 may have a width substantially larger than those of the second and the third masks 462 and 463, and the second mask 462 may also have a width substantially wider than that of the third mask 463.

The fourth conductive layer 455 and the third conductive layer 450 are etched using the first to the third masks 461, 462 and 463 as etching masks to thereby form a control gate structure 470, an upper electrode structure 471 and a preliminary buried shield structure 472. The control gate structure 470 is formed on the first dielectric layer pattern 436 in the first area I, and the upper electrode structure 471 is positioned on the lower electrode 411 and the second dielectric layer pattern 437 in the second area II. The preliminary buried shield structure 472 is disposed on the third isolation layer pattern 424 between the first and the second areas I and II.

The control gate structure 470 includes the first control gate 441, a second control gate 451 and a third control gate 456. The second and the third control gates 451 and 456 are formed by etching portions of the third and the fourth conductive layers 450 and 455 in the first area I. As described above, the cell transistors may additionally share the second control gate 451 and the third control gate 456. The upper electrode structure 472 has the first upper electrode 442, a second upper electrode 452 and a third upper electrode 457. The second and the third upper electrodes 452 and 457 are formed by etching portions of the third and the fourth conductive layers 450 and 455 in the second area II. Because the first upper electrode 442 is electrically contacted with the lower electrode 411, the upper electrode structure 472 may be electrically connected to the lower electrode 411.

The preliminary buried shield structure 472 includes a first pattern 453, a second pattern 458 and the third mask 463. The first pattern 453 is positioned on the third isolation layer pattern 424. The first pattern 453 and the second pattern 458 are formed by etching portions of the third conductive layer 450 and the fourth conductive layer 455 between the first and the second areas I and II. The preliminary buried shield structure 472 may be formed together with the cell transistors and the high voltage gate structures without any additional process.

The second spacer 432 is removed in the formation of the high voltage gate structures in the second area II. Further, widths of the lower electrode 411, the second dielectric layer pattern 437 and the first upper electrode 442 may be reduced because the lower electrode 411, the second dielectric layer pattern 437 and the first upper electrode 442 may be partially etched while forming the high voltage gate structures in the second area II.

Figure 33:
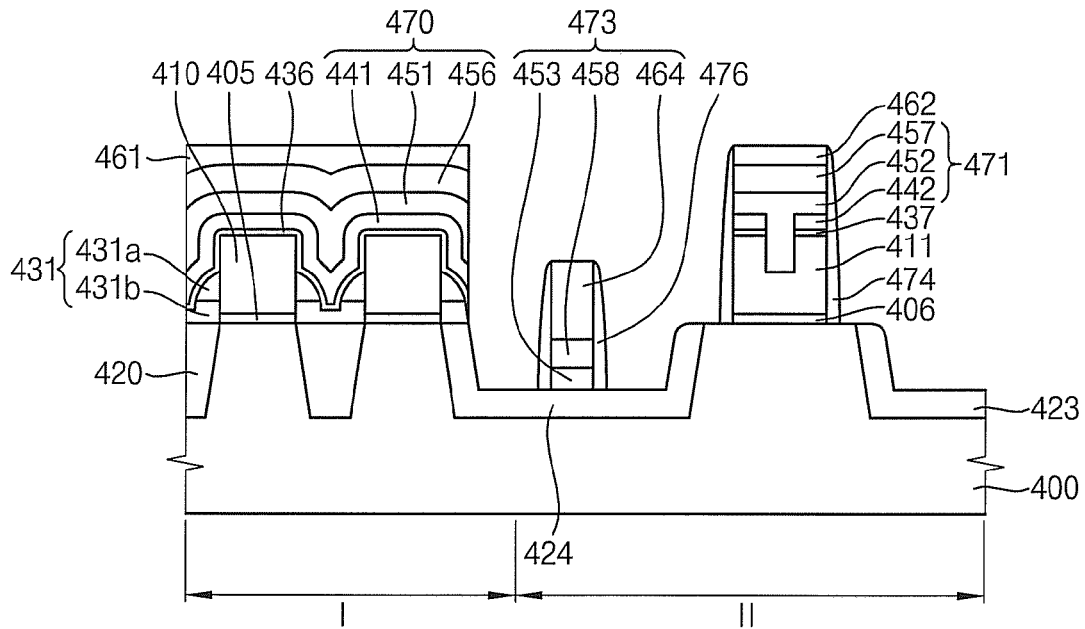

Referring to FIG. 33, the third mask 463 of the preliminary buried shield structure 472 is partially removed to form a third pattern 464 on the second pattern 458. When the third mask 463 has the carbon film and the nitride film, the carbon and the nitride films may be removed to form the third pattern 464 having a thickness greatly smaller than that of the third mask 463, so that a buried shield structure 473 may have a height considerably smaller than that of the preliminary buried shield structure 472. The buried shield structure 473 includes the first to the third patterns 453, 458 and 464.

A third spacer 474 is formed on a sidewall of the high voltage gate structure in the second area II, and a fourth spacer 476 is formed on a sidewall of the buried shield structure 473. The high voltage transistor has the gate insulation layer pattern 406, the lower electrode 411, the second dielectric layer pattern 437, the upper electrode structure 471, the second mask 462, and the third spacer 474.

A spacer layer may be formed along the profile of the buried shield structure 473 and the high voltage gate structure. The spacer layer may be anisotropically etched to form the third spacer 474 and the fourth spacer 476. The third spacer 474 and the fourth spacer 476 may be formed using a nitride or an oxynitride, for example, silicon nitride or silicon oxynitride. Alternatively, the third and fourth spacers 474 and 476 may be formed using an oxide such as silicon oxide such as MTO. Also, source/drain regions (not illustrated) may be formed by implanting impurities using the third and fourth spacers 474 and 476 as an implanting mask.

Figure 34:
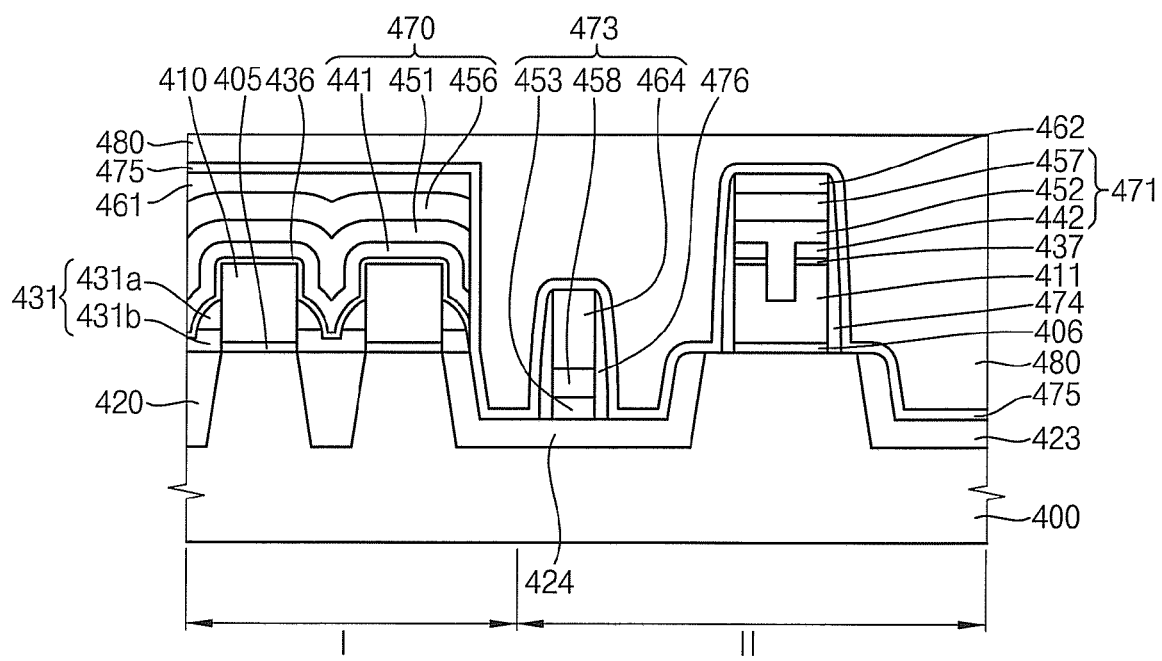

Referring to FIG. 34, an etch-stop layer 475 is formed on the substrate 400 to cover the cell transistor, the buried shield structure 473 and the high voltage transistor. The etch-stop layer 475 may be conformally formed on the second and the third isolation layer patterns 423 and 424 along the profile of the cell transistor, the buried shield structure 473 and the high voltage transistors. The etch-stop layer 475 may be formed using a nitride such as silicon nitride. The etch-stop layer 475 may have a thickness of about 200 Å to about 500 Å measured from upper faces of the second and the third isolation layer patterns 423 and 424.

A first insulation interlayer 480 is formed on the etch-stop layer 475 to cover the cell transistors. The first insulation interlayer 480 may be formed using silicon oxide by a CVD process, an LPCVD process, a PECVD process, an HDP-CVD process, etc. In the formation of the first insulation interlayer 480, a first oxide film may be formed on the etch-stop layer 475 and then a second oxide film may be formed on the first oxide film. The first oxide film may have a thickness of about 1,000 Å to about 2,000 Å, and the second oxide film may have a thickness off about 4,000 Å to about 6,000 Å. Each of the first and the second oxide films may be formed by an HDP-CVD process. When the first insulation interlayer 480 has a multilayer structure, the first insulation interlayer 480 may effectively cover the cell transistors, the buried shield structure 473 and the high voltage transistors without generations of voids or seams therein. After the first insulation interlayer 480 is planarized by a CMP process, a capping layer, an organic layer and an antireflective layer may be formed on the first insulation interlayer 480.

Figure 35:
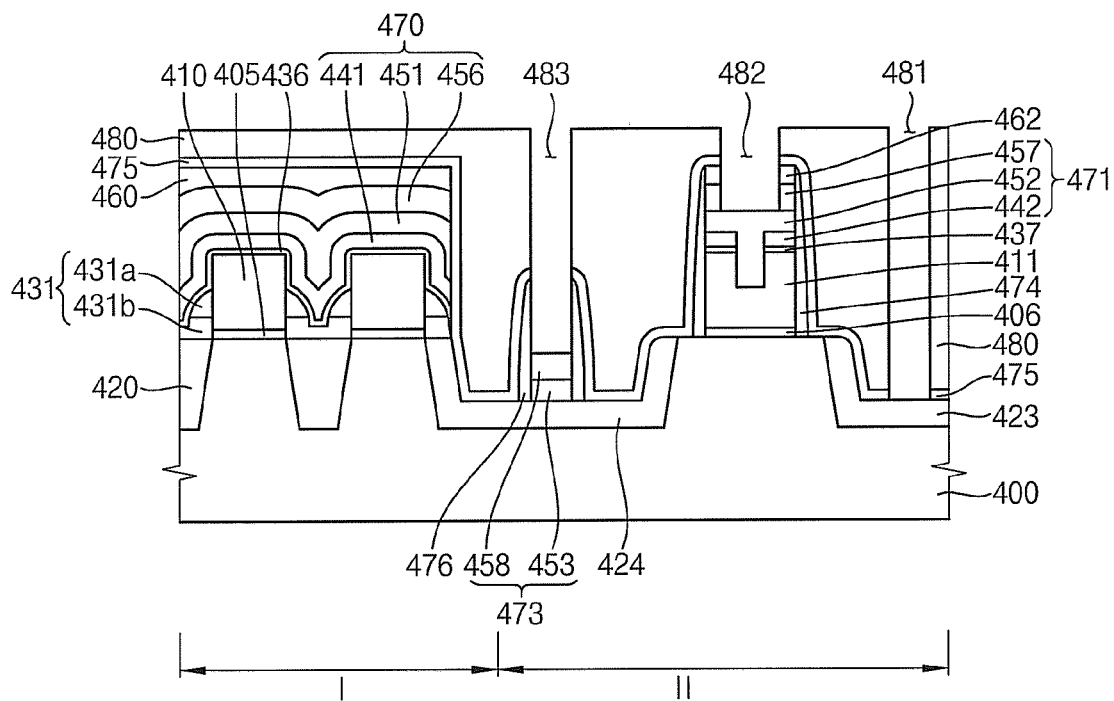

Referring to FIG. 35, the first insulation interlayer 480 and the etch-stop layer 475 are partially etched to form a first contact hole 481, a second contact hole 482 and the third contact hole 483. The first insulation interlayer 480 and the etch-stop layer 475 are etched to form the first contact hole 481 in second area II. The first insulation interlayer 480, the etch-stop layer 475, the second mask 462, and the third upper electrode 457 are etched to form the second contact hole 482. The first insulation interlayer 480, the etch-stop layer 475 and the third pattern 464 are partially etched to form the third contact hole 483 between the first and the second areas I and II. The first contact hole 481 may expose the second isolation layer pattern 423. The second contact hole 482 may expose the second upper electrode 452 of the high voltage transistor. The third contact hole 483 may expose the second pattern 458 of the buried shield structure 473.

Figure 36:
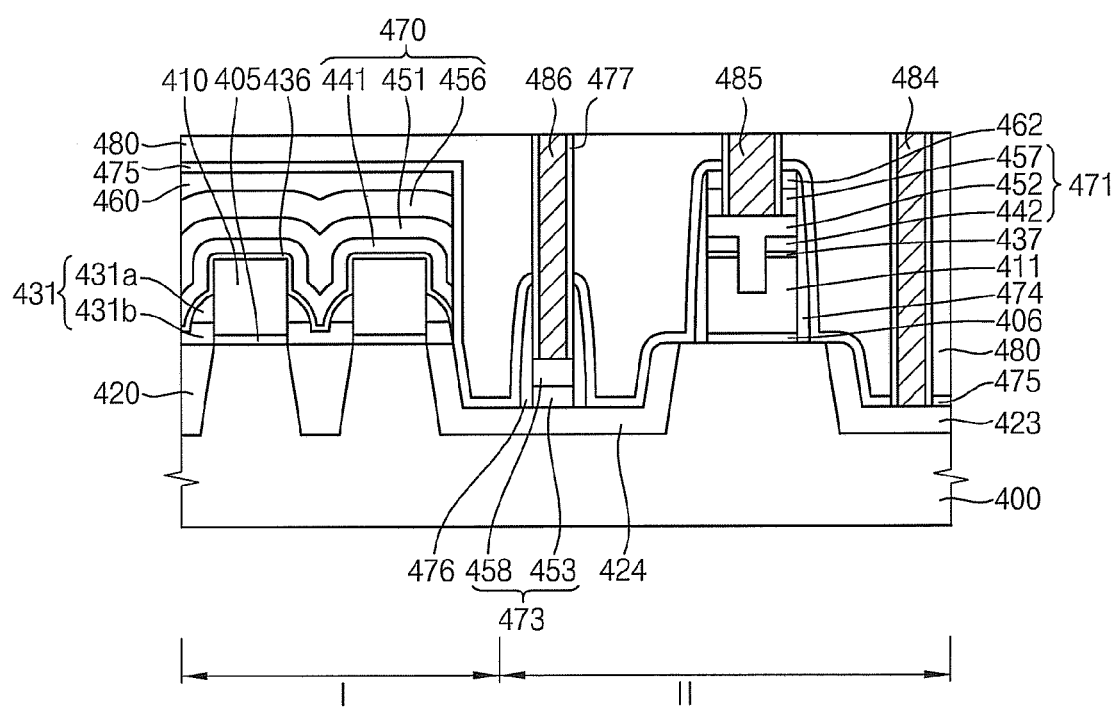

Referring to FIG. 36, a barrier layer 477 is formed on sidewalls of the first to third contact holes 481 to 483. The barrier layer 477 may be formed using a metal having a high melting point by a sputtering process. In example embodiments, the barrier layer 477 may be formed using titanium (Ti), titanium nitride (TiN), titanium tungsten (TiW), titanium/titanium nitride, tantalum (Ta), tantalum nitride (TaN), etc. For example, the barrier layer 477 may have a thickness of about 100 Å.

A metal layer (not illustrated) including tungsten is formed on the first insulation interlayer 480 to fill up the first to third contact holes 481 to 483. The metal layer including tungsten may be formed by a CVD process, a sputtering process, a PECVD process, a PLD process, an evaporation process, etc.

The metal layer including tungsten may be removed by a planarization process until the first insulation interlayer 480 is exposed, such that a first contact 484, a second contact 485 and third contact 486 are formed in the first contact hole 481, the second contact hole 482 and the third contact hole 483, respectively. Through the planarization process, the first to third contacts 484 to 486 may have a convex upper face. The planarization process may include a first CMP process and a second CMP process. The first CMP process may be performed using a first slurry composition which has a substantially higher polishing selectivity with respect to the metal layer than the first insulation interlayer 480. For example, the first slurry composition may include more than about 2 percent by weight of hydrogen peroxide. The second CMP process may be performed using a second slurry composition which has a substantially higher etch selectivity with respect to the first insulation interlayer 480 than the metal layer in order to prevent dishing of the first to third contacts 484 to 486. For example, the second slurry composition may include less than about 0.5 percent by weight of hydrogen peroxide.

Figure 37:
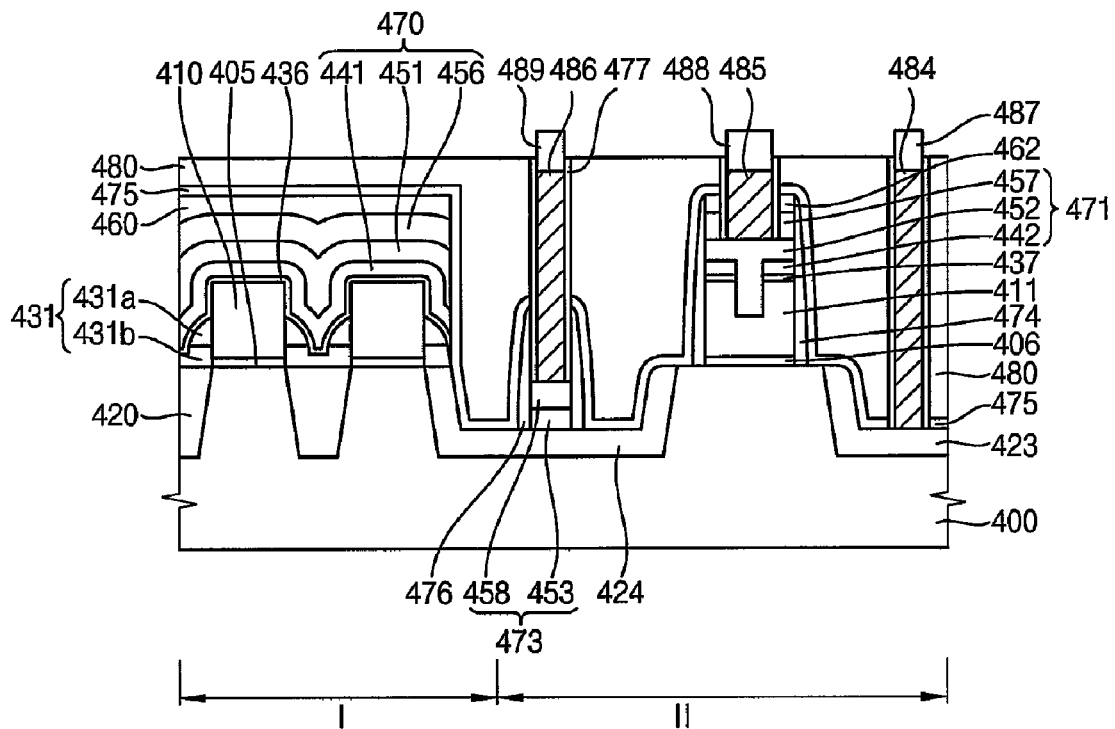

Referring to FIG. 37, a fourth contact 487, a fifth contact 488 and a sixth contact 489 are grown by performing oxidation process from the first contact 484, the second contact 485 and the third contact 486, respectively. When the oxidation process is performed, a tungsten oxide layer used for the fourth to sixth contacts 487 to 489 may be upwardly grown from the first to third contacts 484 to 486 using tungsten in the first to third contacts 484 as a seed by the oxidation process. The formation of the tungsten oxide layer may be substantially similar to formation of a silicon oxide layer which is formed on a silicon substrate by a LOCOS process. The tungsten oxide layer may be grown by combination between tungsten of the first to third contacts 484 to 486 and oxygen to form the fourth to sixth contacts 487 to 489 on the first to third contacts 484 to 486, respectively. The tungsten oxide layer used for the fourth to sixth contacts 487to 489 may be formed by performing an annealing process under an oxygen atmosphere. For example, the annealing process may be performed at a temperature of about 300° C. to about 600° C. for about 30 seconds to about 15 minutes. For example, the annealing process may be performed at a temperature of about 500° C. for about 10 minutes.

While the tungsten oxide layer is formed on the first to third contacts 484 to 486, upper portions of the first to third contacts 484 to 486 may be oxidized. That is, the tungsten oxide layer may include a first portion above the first insulation interlayer 480 and a second portion in the first contact hole 481, the second contact hole 482 or the third contact hole 483. Accordingly, when the first to third contacts 484 to 487 are formed, the thickness of the first to third contacts 484 to 486 may be determined by considering the oxidation amount of the first to third contacts 484 to 486 during formation of the tungsten oxide layer used for the fourth to sixth contacts 487 to 489. For example, when the tungsten oxide layer may have a height of about 1,000 Å from the first insulation interlayer 480, about 300 Å of the first to third contacts 484 to 486 may be oxidized.

Figure 38:
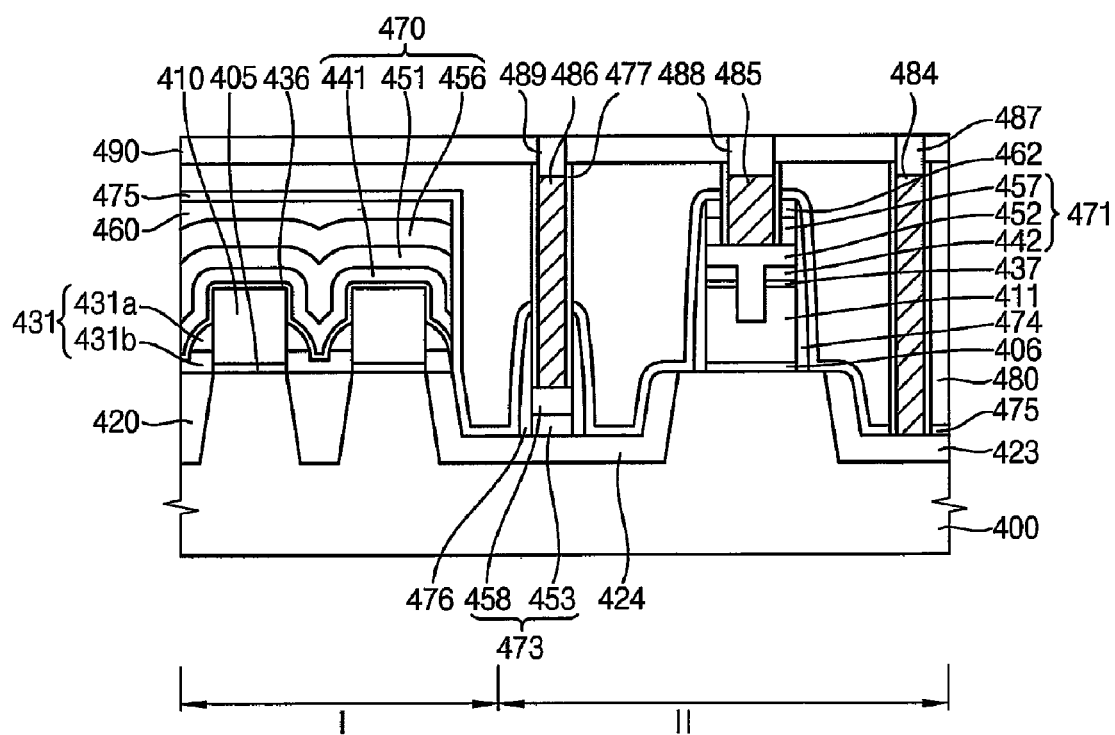

Referring to FIG. 38, a second insulation interlayer 490 is formed on the first insulation interlayer 480 to cover the fourth to sixth contacts 487 to 489. The second insulation interlayer 490 may be formed using silicon oxide by a CVD process, an LPCVD process, a PECVD process, an HDP-CVD process, etc. Then, the second insulation interlayer 490 is planarized by a CMP process until the fourth to sixth contacts 487 to 489 are exposed. The fourth to sixth contacts 487 to 489 are disposed in both the first insulation interlayer 480 and the second insulation interlayer 490 because the upper portions of the first to third contacts 484 to 486 may be oxidized during formation of the tungsten oxide layer used for the fourth to sixth contacts 487 to 489.

In formation of the fourth to sixth contacts 487 to 489, a metal barrier layer may not formed on sidewalls of the fourth to sixth contacts 487 to 489 because the tungsten oxide layer is grown from the first to third contacts 484 to 486. Hence, processes for forming the fourth to sixth contacts 487 to 489 may be simplified and the generation of bridges caused by the metal barrier layer may be reduced. Additionally, a photolithography process and an etching process may not be required, and thus the generation of misalignments may be decreased. The fourth to sixth contacts 487 to 489 are grown from the first to third contacts 484 to 486 to efficiently improve a contact margin.

Figure 39:
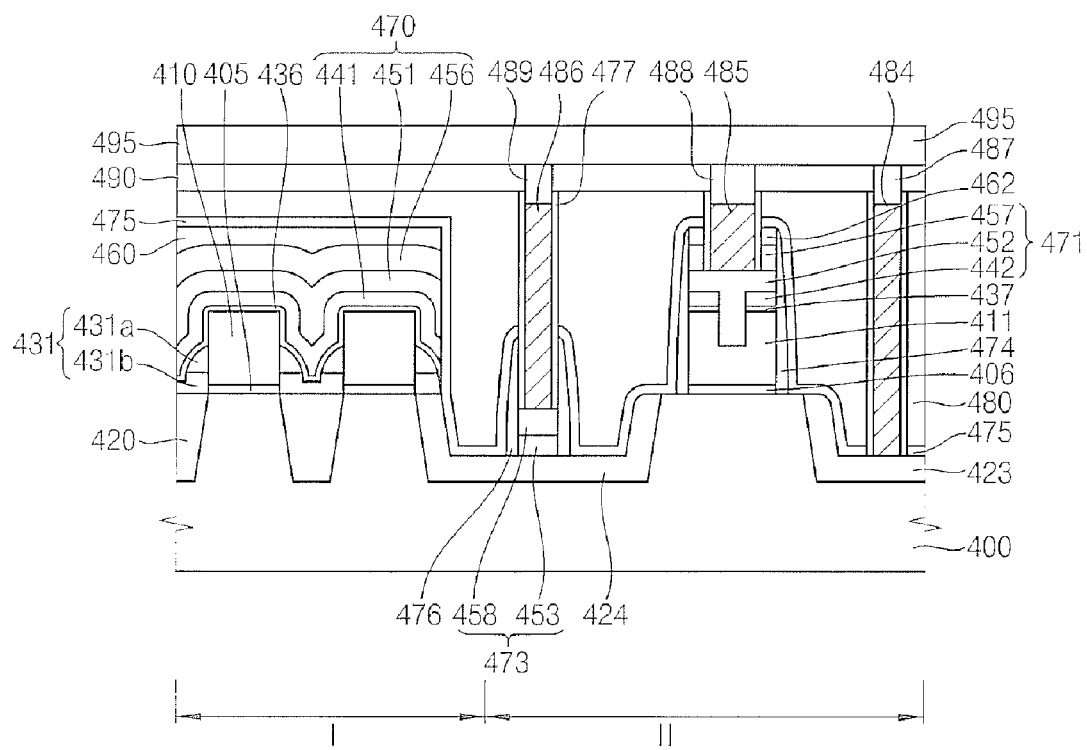

Referring to FIG. 39, a third insulation interlayer 495 is formed on the second insulation interlayer 490 and the fourth to sixth contacts 487 to 489. The third insulation interlayer 495 may be formed using silicon oxide by a CVD process, an LPCVD process, a PECVD process, an HDP-CVD process, etc. Further, third insulation interlayer 495 may be planarized by a CMP process.

Figure 40:
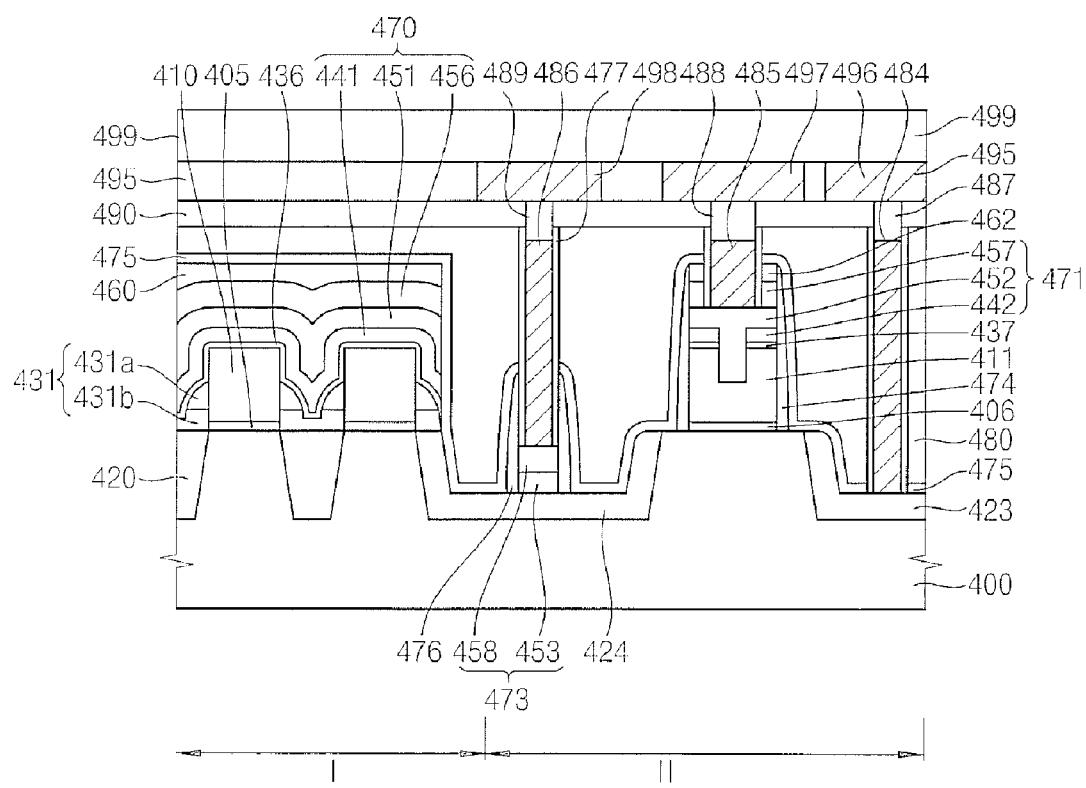

Referring to FIG. 40, a first wiring 496, a second wiring 497 and a third wiring 498 are formed in the third insulation layer 495. The first to third wirings 496 to 498 may be formed using a metal and/or a metal compound by a CVD process, a sputtering process, a PECVD process, a PLD process, an evaporation process, etc. An additional insulation interlayer or a wiring may be formed on the third insulation interlayer 495. After forming the first to third wirings 496 to 498, a protective layer 499 is formed on the third insulation interlayer 495.

In accordance with example embodiments, the fourth to sixth contacts 487 to 489 may be formed without performing a photolithography process and an etching process to simplify a method of manufacturing the flash memory device. Further, in the flash memory device, a lower conductive structure may be efficiently connected to an upper conductive structure using the fourth to sixth contacts 487 to 489 formed by a self-aligned process.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it may be understood that the foregoing may be illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a contact structure, comprising:
   forming a first insulation layer including a first contact hole on a substrate;
   forming a metal layer including tungsten on the first insulation layer to fill the first contact hole;
   performing a planarization process on the metal layer until the first insulation layer is exposed to form a first contact;
   performing an oxidation process to grow a second contact from the first contact; and
   forming a second insulation layer on the first insulation layer to cover the second contact,
   wherein the second contact includes a lower portion and an upper portion, the lower portion of the second contact disposed in the first insulation layer and formed by oxidizing an upper portion of the first contact, and the upper portion of the second contact disposed in the second insulation layer.

2. The method of claim 1,
   wherein said performing the planarization process on the metal layer comprises:
   performing a first chemical mechanical polishing (CMP) process using a first slurry composition which has a first concentration of hydrogen peroxide; and
   performing a second CMP process using a second slurry composition which has a second concentration of hydrogen peroxide, the first concentration of hydrogen peroxide being higher than the second concentration of hydrogen peroxide.

3. The method of claim 2, wherein said performing an oxidation process comprises performing a plasma treatment or an annealing process under an oxygen atmosphere.

4. The method of claim 3, wherein the annealing process is performed at a temperature of about 300° C. to about 600° C. for about 30 seconds to about 15 minutes.

5. The method of claim 2, wherein the second contact comprises tungsten oxide.

6. The method of claim 2, wherein the second contact protrudes from the first insulation layer.

7. The method of claim 2, wherein the first contact has a convex upper face.

8. The method of claim 2, further comprising forming a barrier layer in the first contact hole, prior to said forming a metal layer.

9. The method of claim 8, wherein the barrier layer comprises titanium and titanium nitride.

10. The method of claim 2, further comprising forming a conductive structure on the substrate, prior to said forming a first insulation layer.

11. The method of claim 1, further comprising:
    forming a second contact hole exposing the conductive structure; and
    filling the second contact hole by forming a conductive layer on the second insulation layer to form a third contact electrically connected to the conductive structure.

12. A method of forming a contact structure, comprising:
    forming a first insulation layer including a first contact hole on a substrate;
    forming a metal layer including tungsten on the first insulation layer to fill the first contact hole;
    performing a planarization process on the metal layer until the first insulation layer is exposed to form a first contact;
    performing an oxidation process to grow a second contact from the first contact;
    forming a conductive structure on the substrate, prior to said forming a first insulation layer;
    forming a second insulation layer on the first insulation layer to cover the second contact;
    forming a second contact hole exposing the conductive structure; and
    filling the second contact hole by forming a conductive layer on the second insulation layer to form a third contact electrically connected to the conductive structure;
    wherein the third contact is electrically isolated from the first and second contacts, and
    wherein said performing the planarization process on the metal layer comprises:
    performing a first chemical mechanical polishing (CMP) process using a first slurry composition which has a first concentration of hydrogen peroxide; and
    performing a second CMP process using a second slurry composition which has a second concentration of hydrogen peroxide, the first concentration of hydrogen peroxide being higher than the second concentration of hydrogen peroxide.

13. A method of forming a contact structure, comprising:
- forming a first insulation layer including a first contact hole on a substrate;
- forming a metal layer including tungsten on the first insulation layer to fill the first contact hole;
- performing a planarization process on the metal layer until the first insulation layer is exposed to form a first contact;
- performing an oxidation process to grow a second contact from the first contact;
- forming a second insulation layer on the first insulation layer to cover the second contact;
- removing the second contact to form a second contact hole exposing the first contact;
- forming a third contact hole exposing the conductive structure; and
- forming a conductive layer on the second insulation layer to fill the second and third contact holes.

14. The method of claim 13, further comprising forming a mask that covers the second contact hole and exposes a portion of the second insulation layer corresponding to the conductive structure, prior to said forming a third contact hole.

15. The method of claim 13, further comprising forming a barrier layer on sidewalls of the second and third contact holes, prior to said forming a conductive layer on the second insulation layer.

16. The method of claim 13, wherein the second contact hole includes a lower portion and an upper portion, the lower portion disposed in the first insulation layer and the upper portion disposed in the second insulation layer.

17. The method of claim 13, wherein the conductive layer is formed using a material having a lower resistance than tungsten oxide.

* * * * *